(12) United States Patent  
Shimamura

(10) Patent No.: US 7,302,660 B2
(45) Date of Patent: Nov. 27, 2007

(54) STANDARD CELL, STANDARD CELL LIBRARY, SEMICONDUCTOR DEVICE, AND PLACING METHOD OF THE SAME

(75) Inventor: Akimitsu Shimamura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 179 days.

(21) Appl. No.: 11/300,304

(22) Filed: Dec. 15, 2005

(65) Prior Publication Data

US 2006/0138464 A1    Jun. 29, 2006

(30) Foreign Application Priority Data

Dec. 17, 2004  (JP)  ............................. 2004-366515
Nov. 16, 2005  (JP)  ............................. 2005-331926

(51) Int. Cl.
G06F 17/60 (2006.01)
H01L 27/10 (2006.01)

(52) U.S. Cl. ........................... 716/8; 257/206; 257/499; 257/E27.001

(58) Field of Classification Search .................... 716/8; 257/206, 499

See application file for complete search history.

(56) References Cited

U.S. PATENT DOCUMENTS 6,849,906 B2    2/2005    Maeno et al.

FOREIGN PATENT DOCUMENTS

JP    2004-079702    3/2004

OTHER PUBLICATIONS

Lee, Bu-Yeol., et al. "Low-Power CMOS Standard Cell Library." (w/Partial English translation) URL: http://ne.nikkeibp.co.jp/IPJapan/ipaward/990618ipa8.html.

*Primary Examiner*—Evan Pert
(74) *Attorney, Agent, or Firm*—McDermott Will & Emery LLP

(57) ABSTRACT

Of a plurality of standard cells in which an N-well region and a P-well region are vertically formed, some standard cells have a border line between the N-well region and the P-well region which is set to be a low height (first height), and other standard cells have a border line between the N-well region and the P-well region which is set to be a high height (second height), depending on the size of a transistor formed in the standard cell. Although these standard cells have different border lines, a standard cell for linking the border lines is provided. In such a standard cell, an empty space is created by forming a small-size transistor therein, and the empty space is utilized so that, for example, a left end of the border line is set to have the first height and a right end of the border line is set to have the second height, whereby the border line is converted so as to link the heights therein.

24 Claims, 32 Drawing Sheets

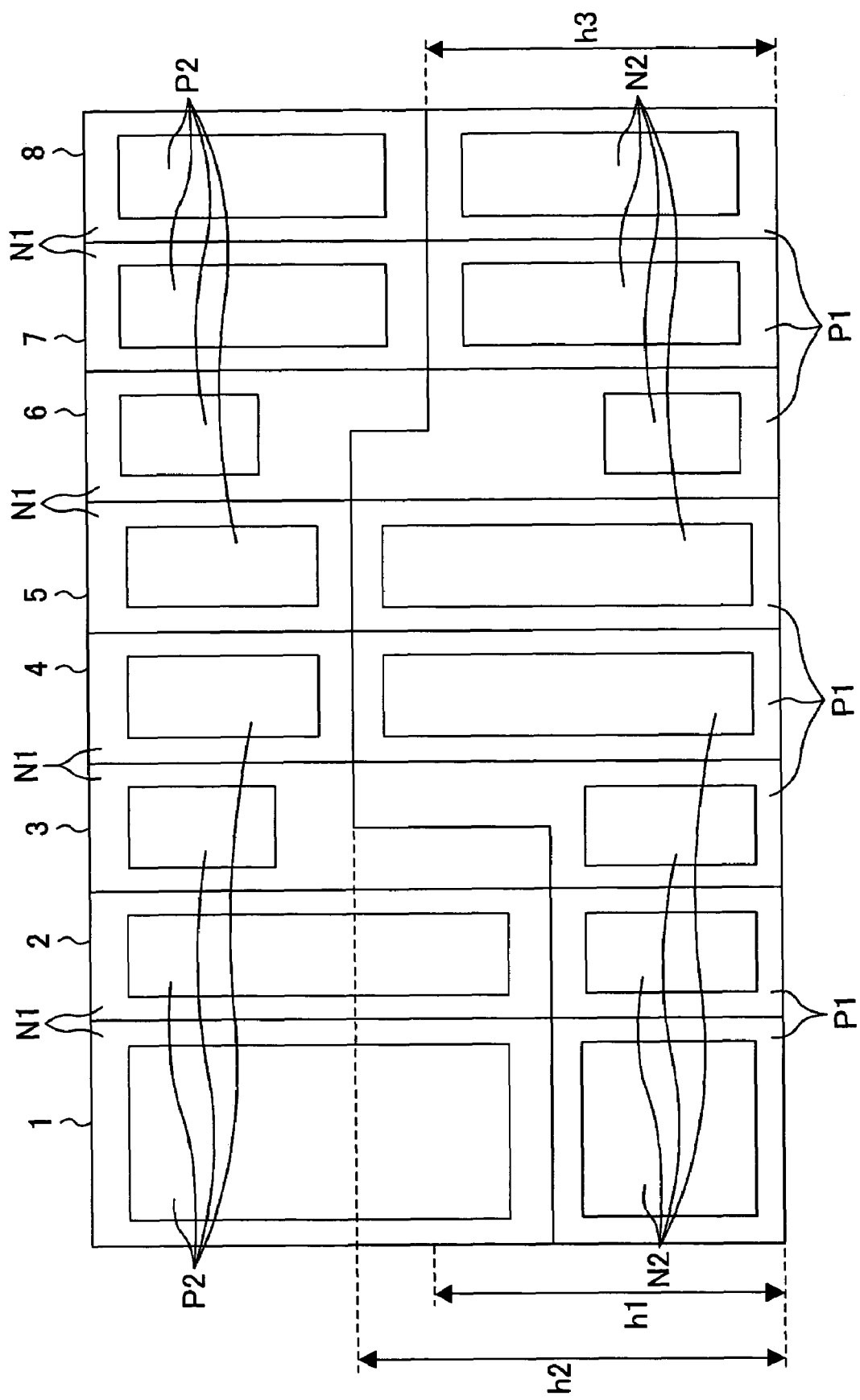

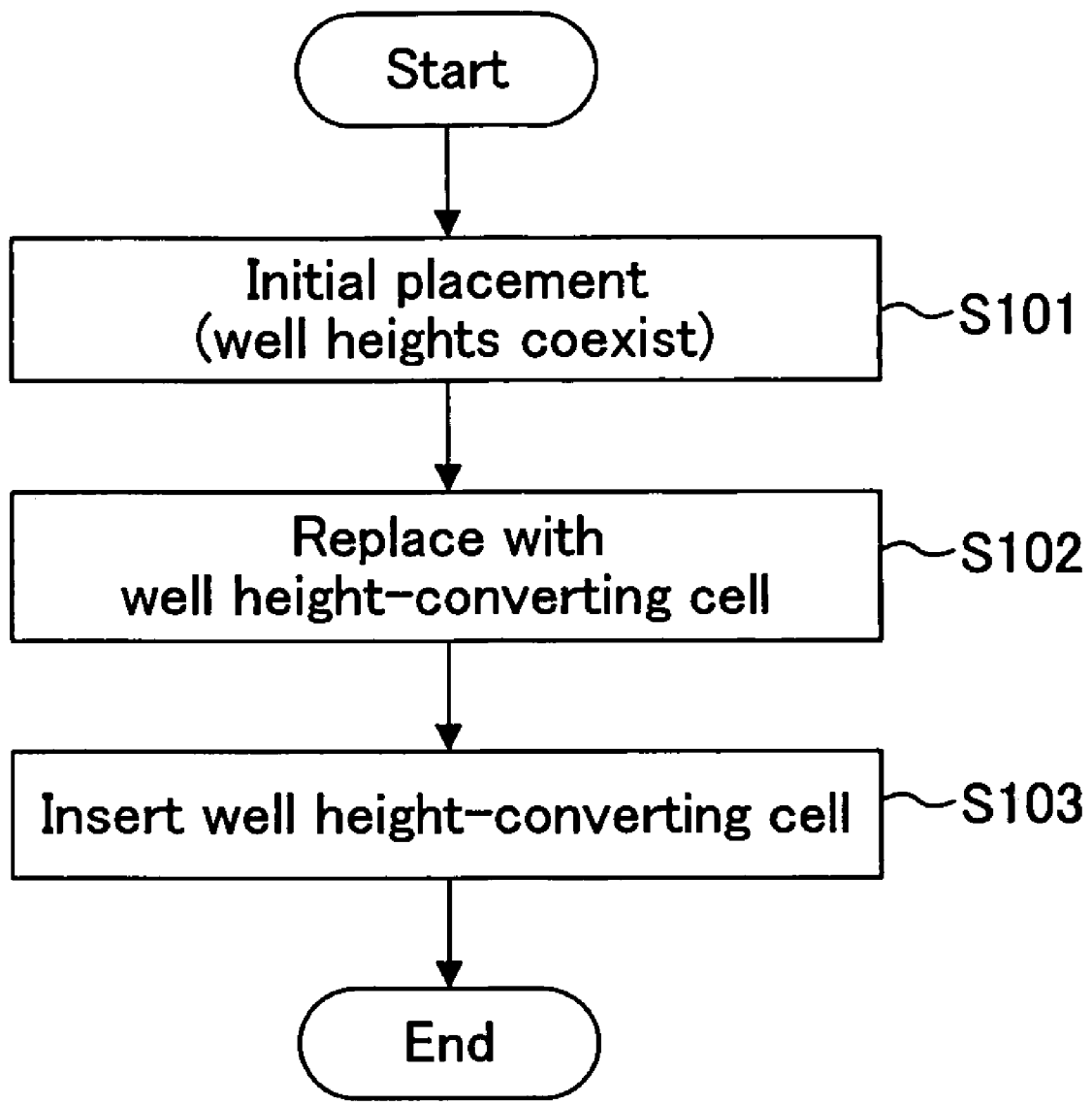

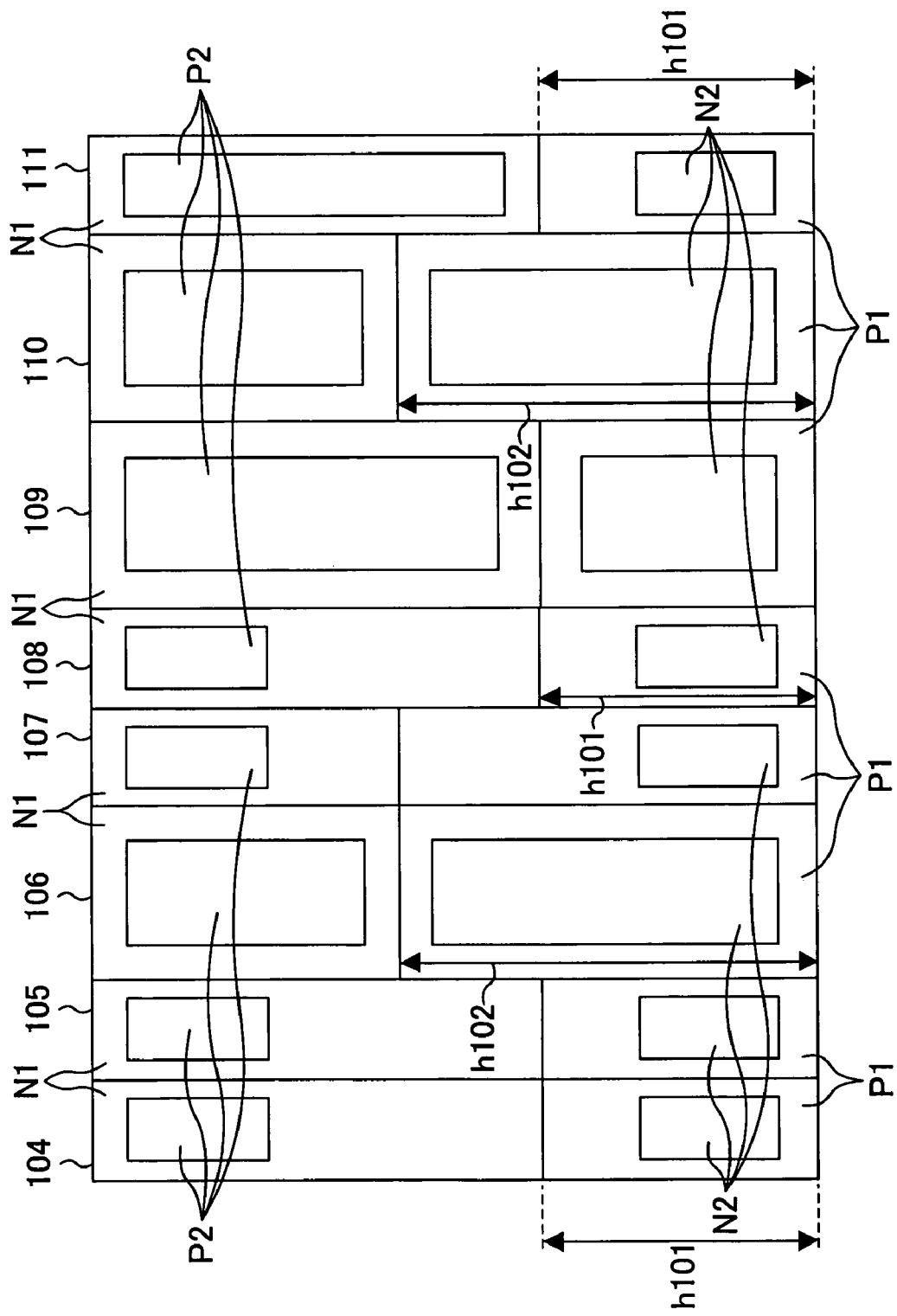

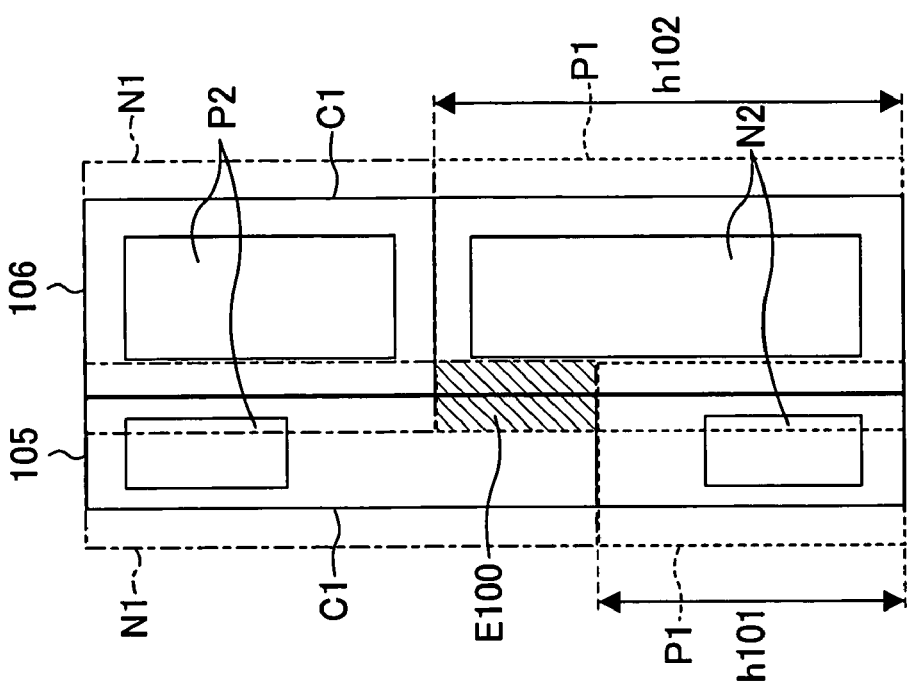
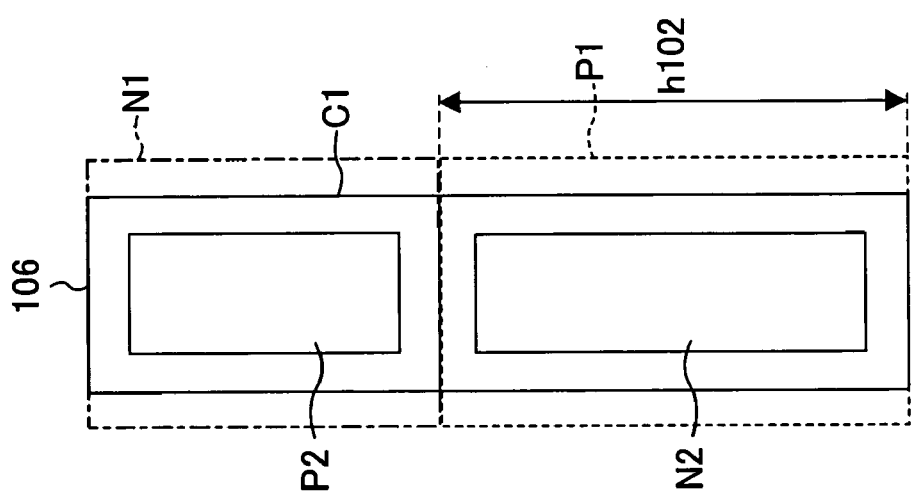
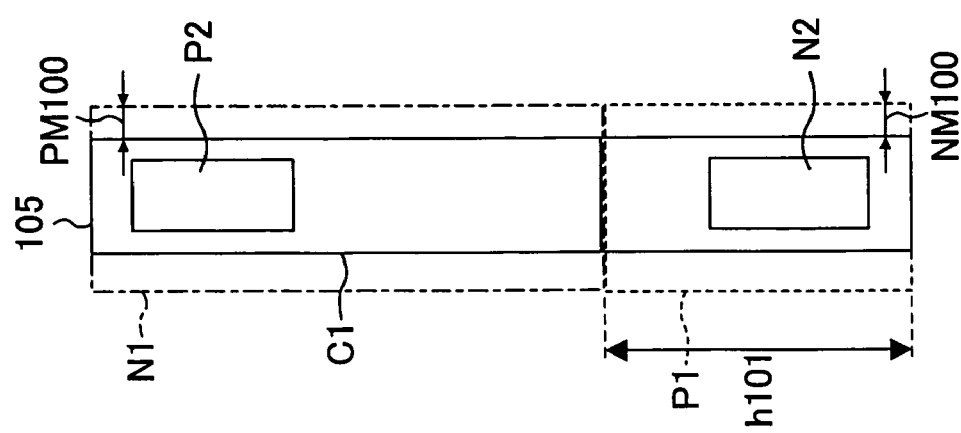

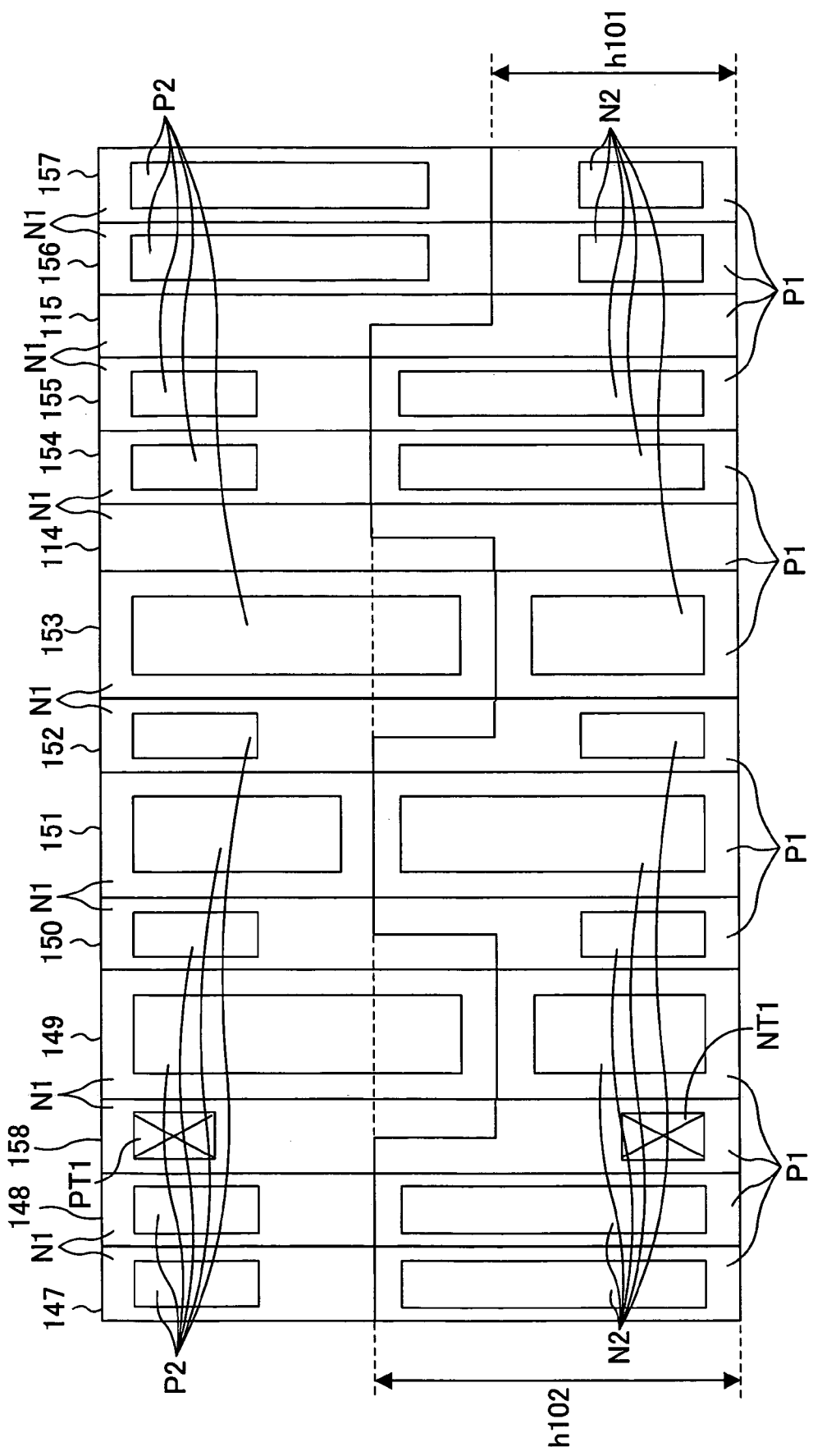

270 Well height-converting antenna cell

280 Well height-converting feed cell

300 H-level output cell

300 Well height-converting H-level output cell

310  L-level output cell

310
Well height-converting
L-level output cell

US 7,302,660 B2

STANDARD CELL, STANDARD CELL LIBRARY, SEMICONDUCTOR DEVICE, AND PLACING METHOD OF THE SAME

CROSS REFERENCE TO RELATED APPLICATIONS

This Non-provisional application claims priority under 35 U.S.C. § 119(a) on Patent Application No. 2004-366515 filed in Japan on Dec. 17, 2004 and Patent Application No. 2005-331926 filed in Japan on Nov. 16, 2005, the entire contents of which are hereby incorporated by reference.

BACKGROUND OF THE INVENTION

1. Field of the Invention

The present invention relates to a standard cell, a standard cell library, a semiconductor device, and a placing method of the same.

2. Description of the Related Art

In conventional standard cell semiconductor devices, a number of standard cells are supposed to have substantially the same height so that they can be placed without a gap, i.e., with high density. Further, the cells have the same height of a border line between a P-well region and an N-well region (hereinafter referred to as a well border line height) so that an area efficiency of each individual standard cell is increased and a design rule error does not occur when the cells are placed.

FIG. 31 is a diagram illustrating an exemplary placement of a conventional standard cell semiconductor device. 100 to 138 each represent a standard cell, and h100 represents a height of the standard cell. hP represents a height of a P-well region, and hN represents a height of an N-well region. In FIG. 31, the standard cells have the same set height h100, the P-well regions of the standard cells have the same set height hP of the border line, and the N-well regions of the standard cells have the same set height hN.

In such a conventional standard cell type, when a semiconductor integrated circuit having standard cells having different heights is realized, the standard cells are divided into blocks or columns, in each of which standard cells have the same height. This technique is described in, for example, JP 2004-79702 A.

Also, when a transistor is optimized by, for example, modifying the diffusion layer into a double-layer structure within standard cells, the standard cells have the same height and the well border lines within the standard cells have the same height. This technique is disclosed in, for example, Bu-Yeol Lee and two other persons, "Low-power CMOS Standard Cell Library", winning the IP award in the 1st LSI IP Design Award (1999), which was found on the Internet on Jun. 3, 2004: URL: http//ne.nikkeibp.co.jp/IPJapan/ipaward/990618ipa8.html.

However, in the case where standard cells have the same high height and the well border lines thereof have the same height, when a transistor having a low level of performance (i.e., a so-called small-size transistor) is realized, a useless region may occur and therefore the area efficiency may be reduced. FIG. 32 is a diagram illustrating a specific example of this situation, i.e., a standard cell which has a CMOS structure employing a small-size transistor and has a low level of area efficiency. In FIG. 32, the standard cell comprises a P-type diffusion region P2 for forming a P-type transistor in an N-well region N1 and an N-type diffusion region N2 for forming an N-type transistor in a P-well region P1. In FIG. 32, 140 indicates gate connection, and WP and WN, and LP and LN indicate transistor dimensions. WP is a width in a height direction of the P-type transistor, WN is a width in a height direction of the N-type transistor, LP is a gate length of the P-type transistor, and LN is a gate length of the N-type transistor. W103 indicates an interval between the P-type diffusion region P2 and the N-type diffusion region N2. When the low-performance transistors are provided in the standard cell having the high cell height in this manner, a useless region corresponding to the interval W103 occurs and therefore the area efficiency is reduced. Therefore, when a low-performance transistor (i.e., a so-called small-size transistor) is employed, it is preferable in terms of efficiency that a standard cell having a low cell height be designed.

Conversely, when standard cells have the same low height and the well border lines thereof have the same height, a plurality of transistors need to be provided so that these are connected in parallel in order that a high-performance transistor (i.e., a so-called large-size transistor) can be realized in a standard cell having a low cell height. When an attempt is made to provide a large-size transistor in a standard cell having a low height in this manner, the standard cell has a longer width in a traverse direction (perpendicular to the height direction) than in the height direction, and a gap region occurs at a border between P and N wells, resulting in a low level of area efficiency. As a specific example of this, FIG. 33 illustrates a standard cell which has a low cell height and in which a high-performance CMOS transistor is provided. In the standard cell of FIG. 33, a P-type diffusion region P2 is provided in an N-well region N1 and an N-type diffusion region N2 is provided in a P-well region P1, so that a P-type transistor and an N-type transistor are provided. W101 indicates a gap occurring between an upper end of the N-well region N1 and the P-type diffusion region P2, W100 indicates a gap occurring between the P-type diffusion region P2 and the N-type diffusion region N2, and W102 indicates a gap between the N-type diffusion region N2 and a lower end of the P-well region P1. 140 indicates a wiring line which is connected to gates. When the transistor is extended in the traverse direction in this manner, it is necessary to provide an enlarged region corresponding to the distance W101 from the upper end of the N-well region N1 to the P-type diffusion region P2, the distance W102 from the lower end of the P-well region P1 to the N-type diffusion region N2, and the distance W100 of a diffusion region between the P and N wells P1 and N1, resulting in a reduction in the area efficiency of the transistor region. In addition, a transistor having a single gate has a higher current performance per unit length even if the transistor size is the same. Also, the area of a transistor having a single gate can be reduced since gate capacitance does not have a plurality of gate protrusions. Therefore, a standard cell having a high cell height can realize a higher-speed operation even if the transistor size is the same.

There is a lineup of standard cells having various logics (various combinations), including a logic in which P-channel transistors are connected in series, a logic in which N-channel transistors are connected in series, and the like. When transistors are connected in series, the performance of the transistors connected in series needs to be increased in order to obtain a response speed comparable to that of a single transistor. To achieve this, the transistor size needs to be increased. Therefore, when P-channel transistors are connected in series, the P-channel transistor size needs to be increased. When N-channel transistors are connected in series, the N-channel transistor size needs to be increased.

Therefore, in order to minimize the area of a standard cell, the height of a border between the P-well region and the N-well region needs to be changed among standard cells, depending on its application. However, a peripheral portion of the diffusion region is typically designed to be minimized so that the design rule is satisfied, assuming that the well regions of the same type are adjacent to each other, so that standard cells cannot be arranged so that different well regions are adjacent to each other without an increase in area of the peripheral region of the diffusion region. Thus, it is difficult to minimize the area of each standard cell.

SUMMARY OF THE INVENTION

An object of the present invention is to achieve a standard cell placement having a satisfactory level of area efficiency, in which a standard cell has a sufficient height so that the width in the traverse direction of an element, such as a transistor or the like, is not longer than the width in the height direction of the element, and an area for providing a well region can be obtained without an increase in area even when standard cells whose border lines between the N-well region and the P-well region have different heights are adjacent to each other.

To achieve this object, in the present invention, the shape of the border line between the N-well region and the P-well region is changed so that the border line height is converted at one or both ends of a standard cell to fit the border line height of another standard cell adjacent thereto, thereby causing all adjacent well regions to have the same type. Further, the standard cell height is set to be high. For example, a standard cell is designed so that a high-performance and large-size transistor is not longer in the traverse direction than in the height direction and the high-speed performance is exploited. Furthermore, by utilizing a gap region which occurs in a standard cell in which a small element is provided when the standard cell height is high, as a region for converting the border line height, the area efficiency is increased.

A standard cell according to the present invention has an N-well region and a P-well region, in which a height of the P-well region extending to a border line separating the N-well region and the P-well region is different between at one end thereof and at the other end thereof, both the ends contacting other standard cells.

In an example of the standard cell of the present invention, the N-well region has an active region of a P-type transistor, the P-well region has an active region of an N-type transistor, and the border line between the N-well region and the P-well region converting the height of the P-well region at one end of the standard cell to be different from the height of the P-well region at the other end of the standard cell and forming the P-well region having the different heights at both the ends, is provided in a region between the active region of the P-type transistor in the N-well region and the active region of the N-type transistor in the P-well region.

In an example of the standard cell of the present invention, the N-well region has a diffusion region for an N-well contact, the P-well region has a diffusion region for a P-well contact, and the border line between the N-well region and the P-well region converting the height of the P-well region at one end of the standard cell to be different from the height of the P-well region at the other end of the standard cell and forming the P-well region having the different heights at both the ends, is provided in a region between the diffusion region for an N-well contact in the N-well region and the diffusion region for an N-well contact in the P-well region.

In an example of the standard cell of the present invention, the N-well region has a P-channel power source capacitor transistor, the P-well region has an N-channel power source capacitor transistor, and the border line between the N-well region and the P-well region converting the height of the P-well region at one end of the standard cell to be different from the height of the P-well region at the other end of the standard cell and forming the P-well region having the different heights at both the ends, is provided in a region between the P-channel power source capacitor transistor in the N-well region and the N-channel power source capacitor transistor in the P-well region.

In an example of the standard cell of the present invention, any one well region of the N-well region and the P-well region has a diffusion region for forming a diode for suppressing an antenna action, and the border line between the N-well region and the P-well region converting the height of the P-well region at one end of the standard cell to be different from the height of the P-well region at the other end of the standard cell and forming the P-well region having the different heights at both the ends, is provided in a region other than the diffusion region for forming a diode for suppressing an antenna action.

In an example of the standard cell of the present invention, the N-well region and the P-well region are regions in which a diffusion region is not formed and a wiring line region is provided, and the border line between the N-well region and the P-well region converting the height of the P-well region at one end of the standard cell to be different from the height of the P-well region at the other end of the standard cell and forming the P-well region having the different heights at both the ends, is provided between the N-well region and the P-well region.

In an example of the standard cell of the present invention, the N-well region has an active region of a P-type transistor of outputting an H level, the P-well region has an active region of an N-type transistor, and the border line between the N-well region and the P-well region converting the height of the P-well region at one end of the standard cell to be different from the height of the P-well region at the other end of the standard cell and forming the P-well region having the different heights at both the ends, is provided in a region between the active region of the P-type transistor and the active region of the N-type transistor.

In an example of the standard cell of the present invention, the N-well region has an active region of a P-type transistor, the P-well region has an active region of an N-type transistor of outputting an L level, and the border line between the N-well region and the P-well region converting the height of the P-well region at one end of the standard cell to be different from the height of the P-well region at the other end of the standard cell and forming the P-well region having the different heights at both the ends, is provided in a region between the active region of the P-type transistor and the active region of the N-type transistor.

A standard cell library according to the present invention comprises the standard cell.

A standard cell library according to the present invention comprises a first standard cell having an N-well region and a P-well region, the P-well region having a first height at both ends thereof, a second standard cell having an N-well region and a P-well region, the P-well region having a second height at both ends thereof, and the second height being different from the first height, and a third standard cell having an N-well region and a P-well region, the P-well region having the first height at one end thereof and the second height at the other end thereof.

In an example of the standard cell library of the present invention, the standard cell library further comprises a fourth standard cell having an N-well region and a P-well region, the P-well region having a third height at both ends thereof, and the third height being different from both the first height and the second height, and a fifth standard cell having an N-well region and a P-well region, the P-well region having the third height at one end thereof and the first height or the second height at the other end thereof.

A semiconductor device according to the present invention is designed using the standard cell library comprising the first, second, and third standard cells.

In an example of the semiconductor device of the present invention, the third standard cell has an active region of a P-type transistor in the N-well region and an active region of an N-type transistor in the P-well region, and the border line between the N-well region and the P-well region converting the height of the P-well region at one end of the standard cell to be different from the height of the P-well region at the other end of the standard cell and forming the P-well region having the different heights at both the ends, is provided in a region between the active region of the P-type transistor in the N-well region and the active region of the N-type transistor in the P-well region.

In an example of the semiconductor device of the present invention, the third standard cell has a diffusion region for an N-well contact in the N-well region and a diffusion region for a P-well contact in the P-well region, and the border line between the N-well region and the P-well region converting the height of the P-well region at one end of the standard cell to be different from the height of the P-well region at the other end of the standard cell and forming the P-well region having the different heights at both the ends, is provided in a region between the diffusion region for an N-well contact in the N-well region and the diffusion region for an N-well contact in the P-well region.

In an example of the semiconductor device of the present invention, the third standard cell has a P-channel power source capacitor transistor in the N-well region and an N-channel power source capacitor transistor in the P-well region, and the border line between the N-well region and the P-well region converting the height of the P-well region at one end of the standard cell to be different from the height of the P-well region at the other end of the standard cell and forming the P-well region having the different heights at both the ends, is provided in a region between the P-channel power source capacitor transistor and the N-channel power source capacitor transistor.

In an example of the semiconductor device of the present invention, the third standard cell has a diffusion region for forming a diode for suppressing an antenna action in any one well region of the N-well region and the P-well region, and the border line between the N-well region and the P-well region converting the height of the P-well region at one end of the standard cell to be different from the height of the P-well region at the other end of the standard cell and forming the P-well region having the different heights at both the ends, is provided in a region other than the diffusion region for forming a diode for suppressing an antenna action.

In an example of the semiconductor device of the present invention, the N-well region and the P-well region of the third standard cell are regions in which a diffusion region is not formed and a wiring line region is provided, and the border line between the N-well region and the P-well region converting the height of the P-well region at one end of the standard cell to be different from the height of the P-well region at the other end of the standard cell and forming the P-well region having the different heights at both the ends, is provided between the N-well region and the P-well region.

In an example of the semiconductor device of the present invention, the third standard cell has a an active region of a P-type transistor of outputting an H level in the N-well region and an active region of an N-type transistor in the P-well region, and the border line between the N-well region and the P-well region converting the height of the P-well region at one end of the standard cell to be different from the height of the P-well region at the other end of the standard cell and forming the P-well region having the different heights at both the ends, is provided in a region between the active region of the P-type transistor and the active region of the N-type transistor.

In an example of the semiconductor device of the present invention, the third standard cell has an active region of a P-type transistor in the N-well region and an active region of an N-type transistor of outputting an L level in the P-well region, and the border line between the N-well region and the P-well region converting the height of the P-well region at one end of the standard cell to be different from the height of the P-well region at the other end of the standard cell and forming the P-well region having the different heights at both the ends, is provided in a region between the active region of the P-type transistor and the active region of the N-type transistor.

A placing method according to the present invention for the semiconductor device comprises a placement step of placing a plurality of the first standard cells and a plurality of the second standard cells, a replacement step of replacing any one of predetermined first and second standard cells adjacent to each other of the plurality of first standard cells and the plurality of second standard cells, with the third standard cell, and a third standard cell inserting step of inserting the third standard cell between another first standard cell and another second standard cell adjacent to each other of the plurality of first standard cell and the plurality of second standard cells.

In an example of the placing method of the present invention, the placing method further comprises a placement changing step of determining whether or not the number of portions at which the first standard cell and the second standard cell are adjacent to each other in the semiconductor device is reduced by exchanging placement positions of a predetermined one of the first or second standard cells and another one of the first or second standard cells located within a predetermined region from the predetermined first or second standard cell, and when it is determined that the number of portions is reduced, changing the placement positions.

A placing method according to the present invention for the semiconductor device, in which the semiconductor device further comprises a sixth standard cell having a diffusion region for an N-well contact in the N-well region and a diffusion region for a P-well contact in the P-well region, and having the first height at both ends of the P-well region, and a seventh standard cell having a diffusion region for an N-well contact in the N-well region and a diffusion region for a P-well contact in the P-well region, and having the second height at both ends of the P-well region, comprises a placement step of placing the first standard cell and the second standard cell, a third standard cell inserting step of inserting the third standard cell between the first and second standard cells adjacent to each other, a sixth standard cell insertion step of inserting the sixth standard cell between two of the first standard cells in the predetermined region when the third standard cell is not present in the predetermined region, and a seventh standard cell insertion step of inserting the seventh standard cell between two of the second standard cells in the predetermined region when the third standard cell is not present in the predetermined region.

A placing method according to the present invention for the semiconductor device, in which the semiconductor device further comprises an eighth standard cell having a P-channel power source capacitor transistor in the N-well region and an N-channel power source capacitor transistor in the P-well region, and having the first height at both ends of the P-well region, and a ninth standard cell having a P-channel power source capacitor transistor in the N-well region and an N-channel power source capacitor transistor in the P-well region, and having the second height at both ends of the P-well region, comprises a placement step of placing the first standard cell and the second standard cell, a third standard cell inserting step of inserting the third standard cell between the first and second standard cells adjacent to each other, an eighth standard cell insertion step of inserting the eighth standard cell between two of the first standard cells in the predetermined region when the third standard cell is not present in the predetermined region, and a ninth standard cell insertion step of inserting the ninth standard cell between two of the second standard cells in the predetermined region when the third standard cell is not present in the predetermined region.

In an example of the placing method of the present invention, the placing method further comprises a consumed current analyzing step of analyzing a consumed current amount of the standard cell after placement. The eighth standard cell insertion step inserts the eighth standard cell into two of the first standard cells in a region in which the consumed current amount analyzed by the consumed current analyzing step exceeds a predetermined reference, and the ninth standard cell insertion step inserts the ninth standard cell into two of the second standard cells in a region in which the consumed current amount analyzed by the consumed current analyzing step exceeds the predetermined reference.

As described above, according to the present invention, a semiconductor device comprises a standard cell having different well border line heights at both ends thereof, so that standard cells having different well border line heights can coexist. Thereby, the area of each standard cell can be minimized. As a result, the semiconductor device can achieve a satisfactory level of area efficiency.

Particularly, in the present invention, a standard cell, a substrate contact cell, a power source capacitor cell, an antenna cell, a feed cell, an H- or L-level output cell, or the like which has a low-performance and small-size transistor can be utilized as a well height converting cell. Thereby, even when standard cells having different well border line heights coexist, well regions of the same type can be caused to be adjacent to each other, so that a well region at a periphery of a standard cell can be minimized. Therefore, it is possible to realize a semiconductor device having a satisfactory level of area efficiency even employing a standard cell having a high cell height which is suitable for a high-speed operation.

Also in the present invention, in the case where a semiconductor device is produced using a first standard cell and a second standard cell which have different P-well region heights and a third standard cell for converting a well height, the first or second standard cell is replaced with the third standard cell at a portion where the first standard cell and the second standard cell are adjacent to each other when a third standard cell which has the same function as that of any one of the first and second standard cells is present; and when a third standard cell which has the same function as that of any one of the first and second standard cells is not present, a third standard cell which does not have a transistor and has a minimum area is inserted between the first and second standard cells. Thereby, a semiconductor device whose area increase is suppressed can be realized.

Also in the present invention, placement of a standard cell is changed only when the number of portions at which the first standard cell and second standard cell are adjacent to each other is to be reduced. Thereby, the number of third standard cells which does not have a transistor and has a minimum area to be inserted can be reduced, and an increase in area can be suppressed. Therefore, when standard cells having different P well heights coexist, a semiconductor device in which the area of each standard cell is minimized can be realized.

Also in the present invention, a substrate contact cell or a power source capacitor cell is provided within a desired range having a predetermined interval. Thereby, the number of substrate contact cells or power source capacitor cells to be inserted is limited, so that an increase in area can be suppressed. In addition, when standard cells having different well heights coexist, a semiconductor device in which the area of each standard cell is minimized can be realized.

Also in the present invention, a power source capacitor cell is provided in a region in which a consumed current amount exceeds an arbitrary reference. Thereby, the number of power source capacitor cells to be inserted is limited, so that an increase in area can be suppressed. In addition, when standard cells having different well heights coexist, a semiconductor device in which the area of each standard cell is minimized can be realized.

As described above, according to the present invention, for example, a space occurring when a small element, such as a low-performance transistor or the like, is formed is utilized to change the shape of a border line between an N-well region and a P-well region so that a well height-converting standard cell having different heights at both ends of the border line between the N-well region and the P-well region. Thereby, even when a semiconductor device is designed using a plurality of other standard cells having different well border line heights, a well region which needs to be provided in a design rule can be set to be small, thereby making it possible to miniaturize a semiconductor device to be produced.

BRIEF DESCRIPTION OF THE DRAWINGS

FIG. 2 is a placement diagram illustrating a standard cell semiconductor device according to a second example of the present invention.

FIG. 3 is a flowchart illustrating a placing method for a semiconductor device according to a third example of the present invention.

FIG. 4 is a placement diagram illustrating a placement result of initial placement (step S101).

FIGS. 5A to 5C are diagrams illustrating a relationship between a cell frame and well regions in a standard cell. FIG. 5A is a diagram illustrating a standard cell having a P well height h101. FIG. 5B is a diagram illustrating a standard cell having a P well height. FIG. 5C is a layout diagram when the standard cells of FIGS. 5A and 5B are adjacent to each other.

FIG. 24 is a placement diagram for a semiconductor device just after step S103 is completed.

DESCRIPTION OF THE PREFERRED EMBODIMENTS

Hereinafter, examples of the present invention will be described in detail with reference to the accompanying drawings.

FIRST EXAMPLE

Figure 1:
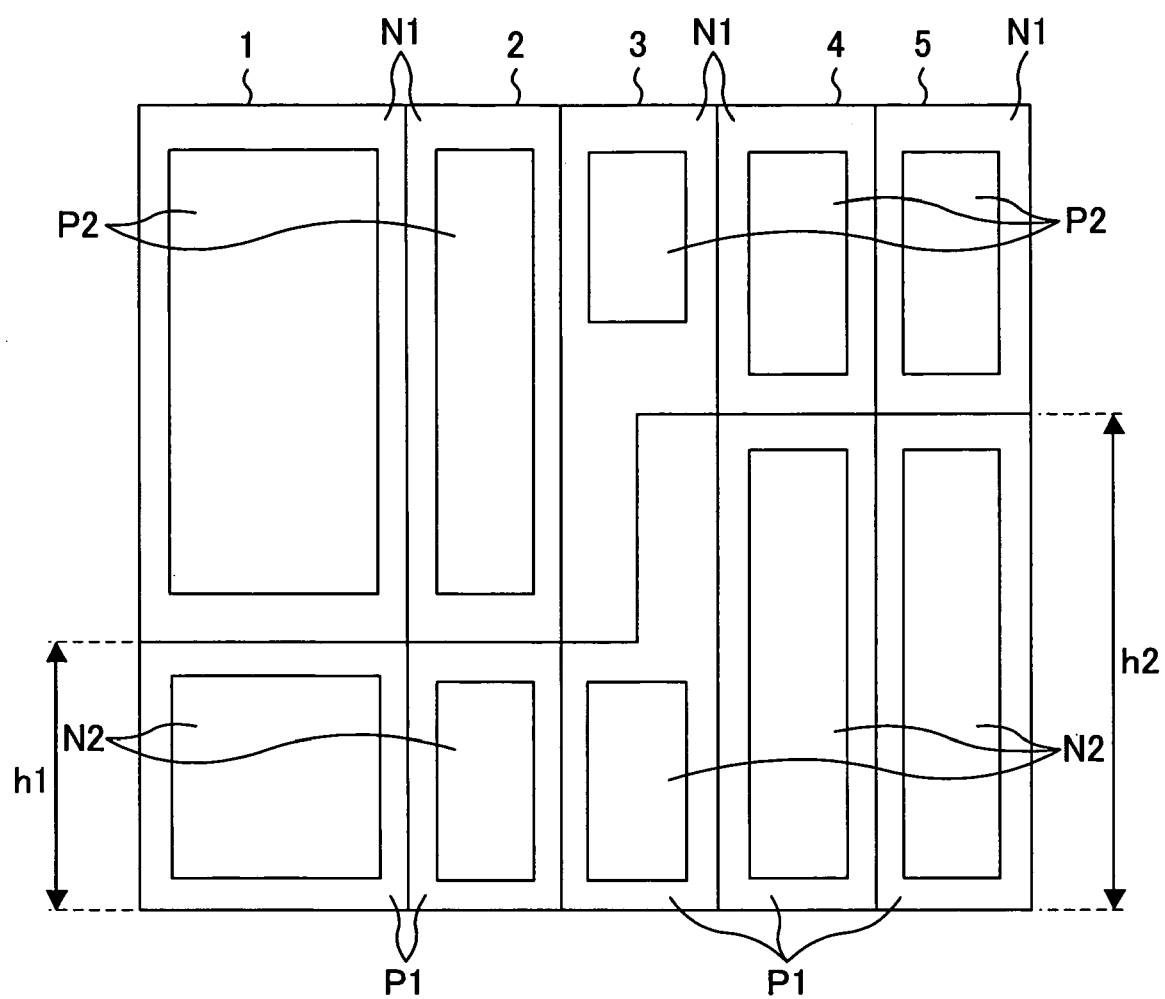
FIG. 1 is a placement diagram illustrating a standard cell semiconductor device according to a first example of the present invention.

FIG. 1 is a standard cell placement diagram illustrating an exemplary layout of a standard cell semiconductor device according to a first example of the present invention. Note that standard cells indicated with the same reference numeral are identical to each other throughout the drawings in the first example or later.

In FIG. 1, 1 to 5 each indicate a standard cell. Each standard cell comprises an N-well region N1 (upper side) and a P-well region P1 (lower side). The N-well region N1 has a P-type diffusion region (P-type active region) P2 for forming a P-channel transistor, and the P-well region P1 has an N-type diffusion region (N-type active region) N2 for forming an N-channel transistor.

In the standard cells 1 to 5, a large-size transistor is realized by setting the height of the standard cell to be high without dividing into a plurality of standard cells using a parallel structure, thereby preventing a reduction in the area efficiency and a reduction in the current performance efficiency. In this manner, the transistor operation speed performance is improved in the standard cell of this example.

The standard cells 1 and 2 are first standard cells in which a size of the P-channel transistor is larger than that of the N-channel transistor, a size of the P-type diffusion region P2 is larger than that of the N-type diffusion region N2, and the P-well region P1 has a height h1 (first height) at both ends thereof. The standard cells 4 and 5 are second standard cells in which a size of the N-channel transistor is larger than that of the P-channel transistor, a size of the N-type diffusion region N2 is larger than that of the P-type diffusion region P2, and the P-well region P1 has a height h2 (second height) which is different from h1, at both ends thereof. In the standard cells 1, 2, 4, and 5, the well border line has a height optimal with respect to the transistor size, thereby minimizing the area of each standard cell.

The standard cell 3 is composed of low-performance transistors and has a structure in which a space in which a diffusion region is not present is provided between the P-type diffusion region P2 and the N-type diffusion region N2. The standard cell 3 is a third standard cell in which the shape of the well border line is changed by utilizing the space so that the well border line have different heights at left and right ends thereof, whereby the height of the border line between the N-well region N1 and the P-well region P1 of the standard cell 2 adjacent thereto on the left side thereof (i.e., the height h1 of the P-well region P1) is converted into the height h2 of the P-well region P1 of the standard cell 4 adjacent thereto on the right side thereof.

Typically, when cells whose well border lines have different heights are placed side by side, the gap between the diffusion regions of wells of different types needs to be larger than the gap between the diffusion regions of wells of the same type, whereby a design rule error is avoided. However, according to this example, the standard cell 3 whose well border line has different heights at both ends thereof is provided between the standard cell 2 and the standard cell 4 so that the wells of the same type are adjacent to each other, and therefore, although the standard cells having different well border line heights are adjacent to each other, the standard cells can be placed with high efficiency so that an interval between the diffusion regions is short, as in the case where standard cells having the same well border line height are adjacent to each other.

As described above, according to this example, the performance of the operation speed of the transistor is improved by setting the cell height of the standard cell to be high, and the area of each standard cell is minimized by setting the height of the well border line depending on the footprint of the transistor placed based on the logic of the standard cell. When the optimal border line is provided, there occurs a plurality of standard cells having different well border line heights. However, typically, when standard cells having different well border line heights are adjacent to each other, well regions of different types are adjacent to each other. In this case, in order to satisfy the design rule, the interval between the diffusion regions of each standard cell needs to be large, compared to when well regions of the same type are adjacent to each other. According to this example, even when standard cells having different well border line heights are adjacent to each other, a space which is obtained in a standard cell having a small-size transistor, other than the diffusion region, is utilized to convert the well border line height so as to fit the well border line height of the adjacent standard cell. Therefore, well regions of the same type are adjacent to each other in the adjacent standard cells. As a result, the standard cells can be placed with high efficiency, thereby making it possible to provide a semiconductor device having an excellent level of operation speed performance and a high level of area efficiency.

SECOND EXAMPLE

FIG. 2 is a standard cell placement diagram illustrating an exemplary layout of a standard cell semiconductor device according to a second example of the present invention.

Standard cells 1 and 2 are first standard cells in which a size of the P-channel transistor is larger than that of the N-channel transistor, a size of the P-type diffusion region P2 is larger than that of the N-type diffusion region N2, and the P-well region P1 has a height h1 (first height) at both ends thereof. Standard cells 4 and 5 are second standard cells in which a size of the N-channel transistor is larger than that of the P-channel transistor, a size of the N-type diffusion region N2 is larger than that of the P-type diffusion region P2, and the P-well region P1 has a height h2 (second height) which is different from h1, at both ends thereof. Standard cells 7 and 8 are fourth standard cells in which a size of the N-channel transistor is equal to that of the P-channel transistor, and the P-well region P1 has a height h3 (third height) which is different from both of h1 and h2, at both ends thereof.

In the standard cells 1, 2, 4, 5, 7, and 8, the well border line has a height optimal with respect to the transistor size, thereby realizing both high speed performance and an area reduction.

A standard cell 3 is composed of low-performance transistors, and has a structure in which a space in which a diffusion region is not present is provided between the P-type diffusion region P2 and the N-type diffusion region N2. The standard cell 3 is a third standard cell in which the shape of the well border line is changed by utilizing the space so that the well border line have different heights at left and right ends thereof, whereby the height of the border line between the N-well region N1 and the P-well region P1 of the standard cell 2 adjacent thereto on the left side thereof (i.e., the height h1 of the P-well region P1) is converted into the height h2 of the P-well region P1 of the standard cell 4 adjacent thereto on the right side thereof.

A standard cell 6 is also composed of low-performance transistors, and has a structure in which a space in which a diffusion region is not present is provided between the P-type diffusion region P2 and the N-type diffusion region N2, as with the standard cell 3. The standard cell 6 is a fifth standard cell in which, by utilizing the space so as to convert the well border line height, the P-well region P1 has the height h2 at one side thereof and the height h3 at the other side thereof.

By placing the standard cell 3 between the standard cells 1 and 2 and the standard cells 4 and 5, and the standard cell 6 between the standard cells 4 and 5 and the standard cells 7 and 8, it is possible to place the standard cells having different well border line heights with high efficiency. Note that, in this example, when one well border line has the height h3, the standard cell 6 converts h3 into h2 as a different well border line height for illustrative purposes. Alternatively, h3 may be converted into h1 in a standard cell (fifth standard cell).

As described above, according to this example, the performance of the operation speed of the transistor is improved by setting the cell height of the standard cell to be high, and the area of each standard cell is minimized by setting the height of the well border line depending on the footprint of the transistor placed based on the logic of the standard cell.

When the optimal border line is provided, there occurs a plurality of standard cells having different well border line heights. However, typically, when standard cells having different well border line heights are adjacent to each other, well regions of different types are adjacent to each other. In this case, in order to satisfy the design rule, the interval between the diffusion regions of each standard cell needs to be large, compared to when well regions of the same type are adjacent to each other. According to this example, even when standard cells having different well border line heights are adjacent to each other, a space which is obtained in a standard cell having a small-size transistor, other than the diffusion region, is utilized to convert the well border line height so as to fit the well border line height of the adjacent standard cell. Therefore, well regions of the same type are adjacent to each other in the adjacent standard cells. As a result, the standard cells can be placed with high efficiency, thereby making it possible to provide a semiconductor device having an excellent level of operation speed performance and a high level of area efficiency.

Particularly in this example, by employing a standard cell possessing the same function and having a function of converting height with respect to three well border line heights, it is possible to construct a standard cell library having a satisfactory level of area efficiency, and use the standard cell library to provide a semiconductor device having a satisfactory level of area efficiency.

THIRD EXAMPLE

FIG. 3 is a flowchart illustrating a placing method for a semiconductor device according to a third example of the present invention. FIGS. 4 to 8 are diagrams illustrating a result of placement of standard cells based on the placing method of FIG. 3, and the standard cells. Hereinafter, the placing method of FIG. 3 will be described with reference to FIGS. 4 to 8.

In FIG. 3, S101 is a standard cell placing step of providing an initial placement in which standard cells having different well border line heights coexist.

FIG. 4 is a standard cell placement diagram illustrating a result of the placement in the standard cell placing step S101. Standard cells 104, 105, 108, 109, and 111 are each a standard cell (first standard cell) whose P-well region has a height h101 (first height). Standard cells 106, 107, and 110 are each a standard cell (second standard cell) whose P-well region has a height h102 (second height) which is different from the height h1.

At the time when the standard cell placing step S101 has been performed, each standard cell has an optimized well height, high-speed performance, and a satisfactory level of area efficiency. However, each of the combinations of the adjacent standard cells 105 and 106, the adjacent standard cells 107 and 108, the standard cells 109 and 110, and the standard cells 110 and 111 has well border line heights different to each other.

FIGS. 5A and 5B illustrate a design rule for well regions of the standard cells 105 and 106 of FIG. 4. Typically, since it is assumed that standard cells having the same well border line height are adjacent to each other, a well region provided around a diffusion region can be set to be small, compared to when the well region is provided singly or adjacent to a different well region. In FIGS. 5A and 5B, a region indicated with a dashed line has a size required in accordance with the design rule when the region is provided singly or adjacent to a different well region. When well regions of the same type are adjacent to each other, the well region can have a structure which is smaller by a width of PM100 with respect to the N-well region N1 and is smaller by a width of NM100 with respect to the P-well region P1 as illustrated in FIG. 5A.

FIG. 5C is a placement diagram in which the standard cells 105 and 106 are adjacent to each other. In a range in which the N-well region N1 of the standard cell 105 and the P-well region P1 of the standard cell 106 are adjacent to each other, a well region is not sufficient, so that a design rule error occurs in a region E100.

Thus, a design rule error occurs in a portion where cells having different well border line heights are adjacent to each other.

In the third example, each of the combinations of the adjacent standard cells 105 and 106, the adjacent standard cells 107 and 108, the adjacent standard cells 109 and 110, and the adjacent standard cells 110 and 111 has well border line heights different from each other, so that a design rule error similarly occurs.

Next, in step S102 of FIG. 3 (standard cell replacing step), replacement with a standard cell which converts a well border line height is performed at a portion where cells having different well border line heights are adjacent to each other.

Figure 6:
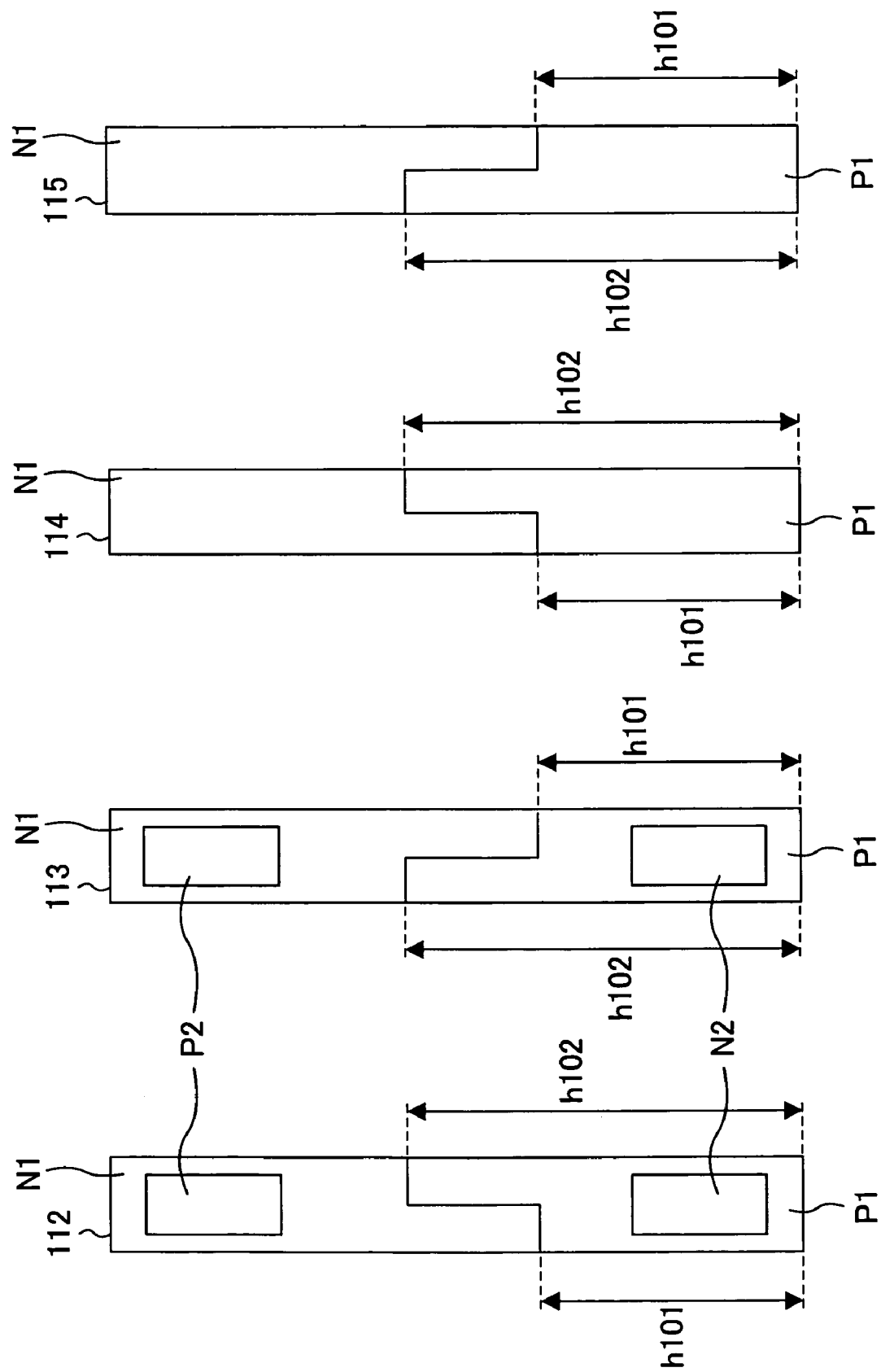
FIG. 6 is a layout diagram of well height-converting standard cells.

In FIG. 6, 112 indicates a standard cell (third standard cell) which has the same function and performance as those of the standard cell 105, has a well border line height h101 (first height) at one side thereof and a well border line height h102 (second height) at the other side opposite to the one side. 114 indicates a standard cell (third standard cell) which converts a well border line height as in the standard cell 112, and does not have a diffusion region for forming a transistor in the N- and P-well regions.

113 indicates a standard cell (third standard cell) which has the same function and performance as those of the standard cell 108, has a well border line height h102 (second height) at one side thereof and a well border line height h101 (third height) at the other side opposite to the one side. 115 indicates a standard cell (third standard cell) which converts a well border line height as in the standard cell 113, and does not have a diffusion region for forming a transistor in the N- and P-well regions. These standard cells which convert a well border line height are herein referred to as well height-converting standard cells.

Figure 7:
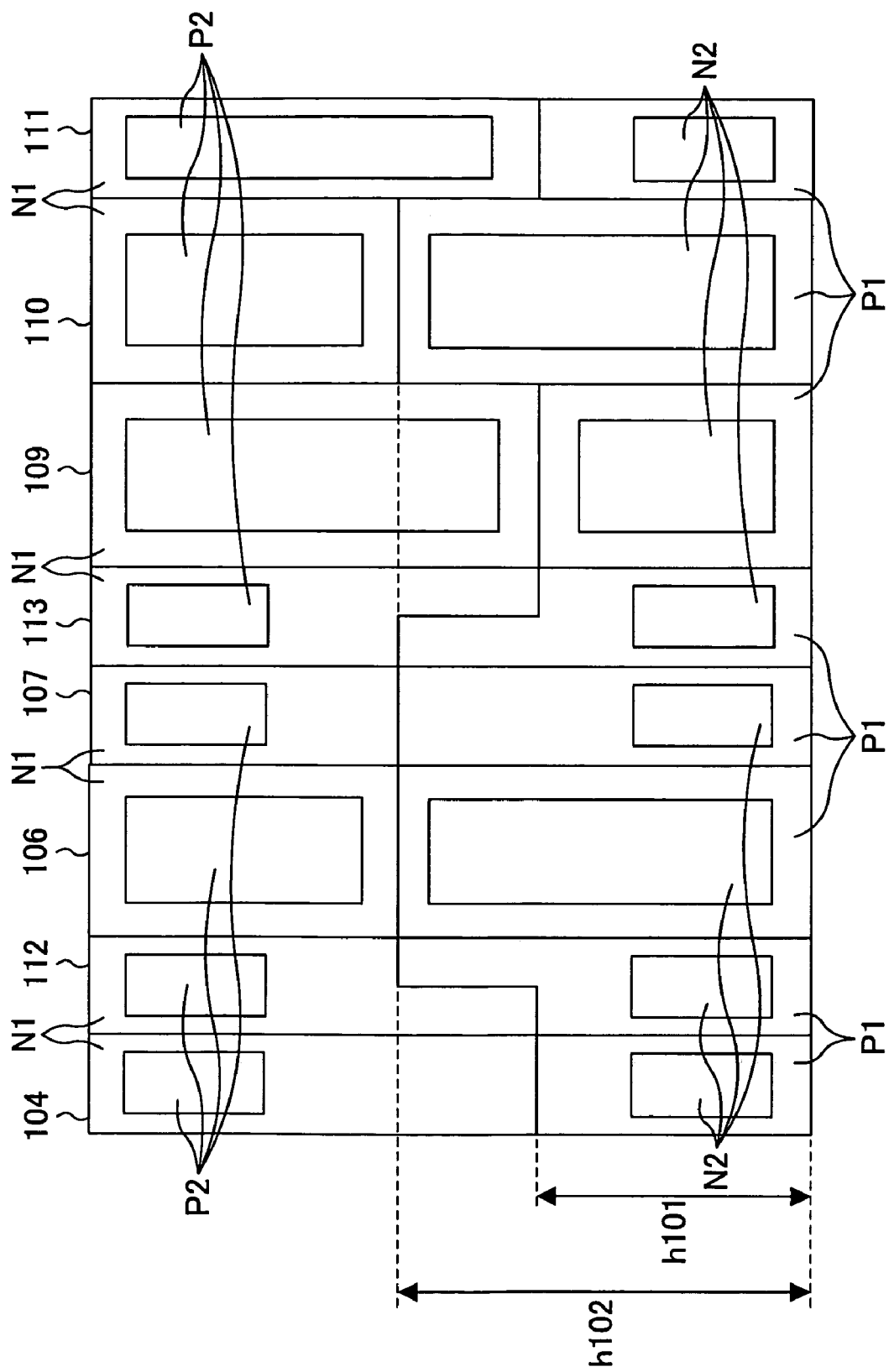
FIG. 7 is a placement diagram of a semiconductor device after conversion into a well height-converting standard cell (step S102).

FIG. 7 is a placement diagram of a semiconductor device in which one of standard cells having different well border line heights at a portion where the cells are adjacent to each other is converted into a well height-converting standard cell in step S102 of FIG. 3. Here, the standard cell 105 is replaced with the standard cell 112 as a well height-converting standard cell, and the standard cell 108 is replaced with the standard cell 113.

Figure 8:
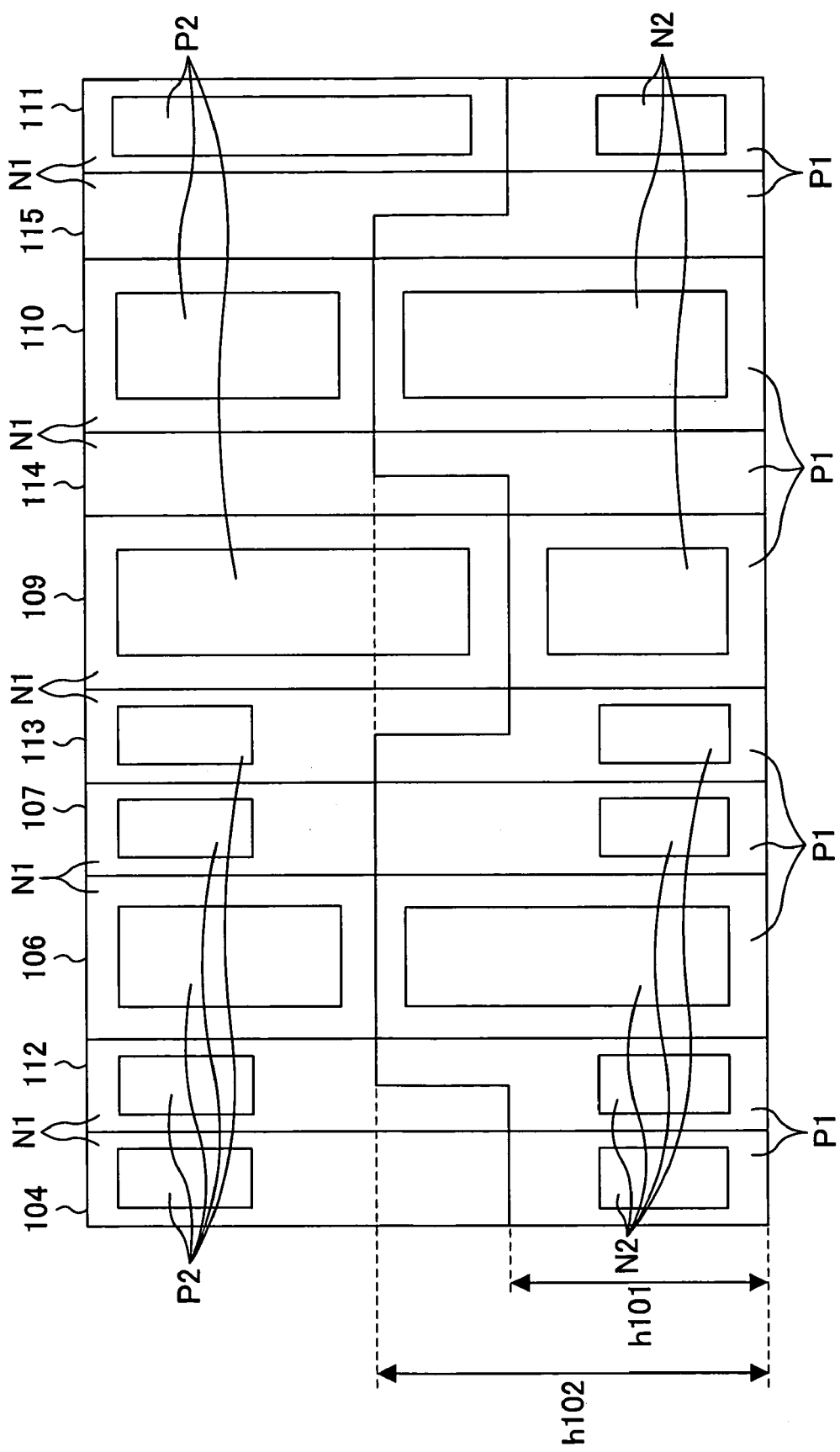
FIG. 8 is a placement diagram of a semiconductor device after insertion into a well height-converting standard cell (step S102).

Next, in step S103 of FIG. 3 (third standard cell inserting step), insertion of a well height-converting standard cell is performed with respect to a portion where cells having different well border line heights are adjacent to each other. In the example of FIG. 7, all of the standard cells 109, 110, and 111 each comprise a large transistor, so that there is not a gap between diffusion regions for converting a well border line height as are similar to the standard cells 112 and 113. Therefore, in this case, of the well height-converting standard cells, the standard cell 114 or 115 which does not have a transistor is inserted between the standard cell 109 and the standard cell 110, and between the standard cell 110 and the standard cell 111. The standard cell 114 also serves as a feed cell, and wiring can be performed in a layer on the cell. As illustrated in FIG. 8, in step S103, the standard cell 114 of the above-described well height-converting standard cells is inserted between the standard cell 109 having the well border line height h1 and the standard cell 110 having the well border line height h102, and the standard cell 115 is inserted between the standard cell 110 having the well border line height h101 and the standard cell 111 having the well border line height h102, thereby realizing a structure which eliminates a design rule error with a minimum area. The standard cell 115 is obtained by reversing the standard cell 114 in the traverse direction.

According to the flow of this example of FIG. 3, a placing method for a semiconductor device in which standard cells having an optimal well height are placed without a design rule error, and which has high-speed performance and an area reduction, is realized.

FOURTH EXAMPLE

Figure 9:
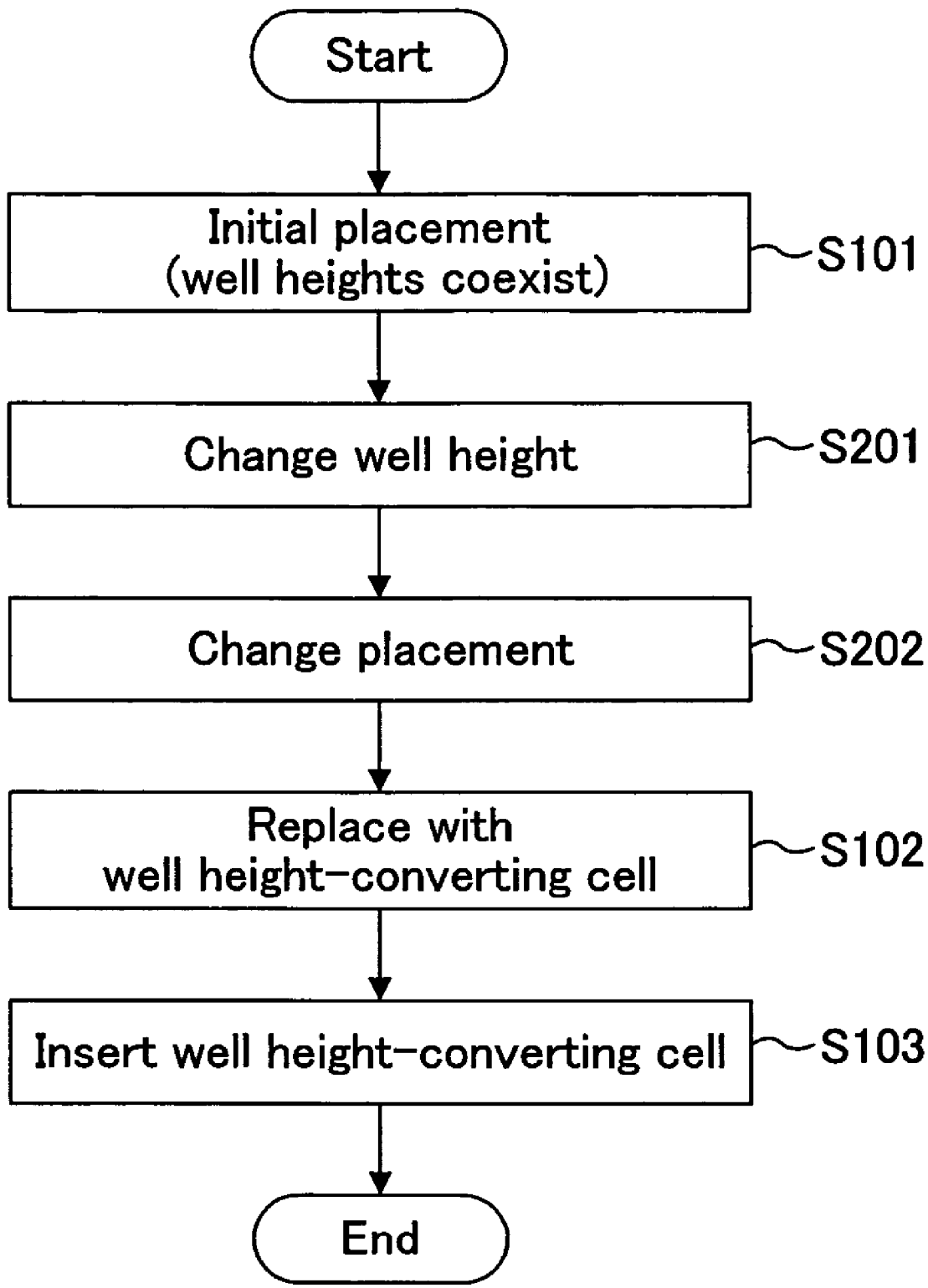
FIG. 9 is a flowchart illustrating a placing method for a semiconductor device according to a fourth example of the present invention.

FIG. 9 is a flowchart illustrating a placing method for a semiconductor device according to a fourth example of the present invention. A height changing step S201 of changing a well border line height and a placement changing step S202 of performing replacement with a standard cell having another placement having the same border line height so as to fit the well border line height of an adjacent standard cell, are added between the standard cell placing step S101 of initially placing standard cells and the standard cell replacing step S102 in the flow of the third example.

After completion of the initial placement S101 of standard cells, the process goes to the well height changing step S201. In step S201, each standard cell is replaced with a standard cell which has the same function and performance and a different well border line height. In step S201, the standard cell replacement is performed only when the number of portions at which standard cells having different well border line heights are adjacent to each other (hereinafter referred to as a contiguous portion) is reduced by it.

Figure 10:
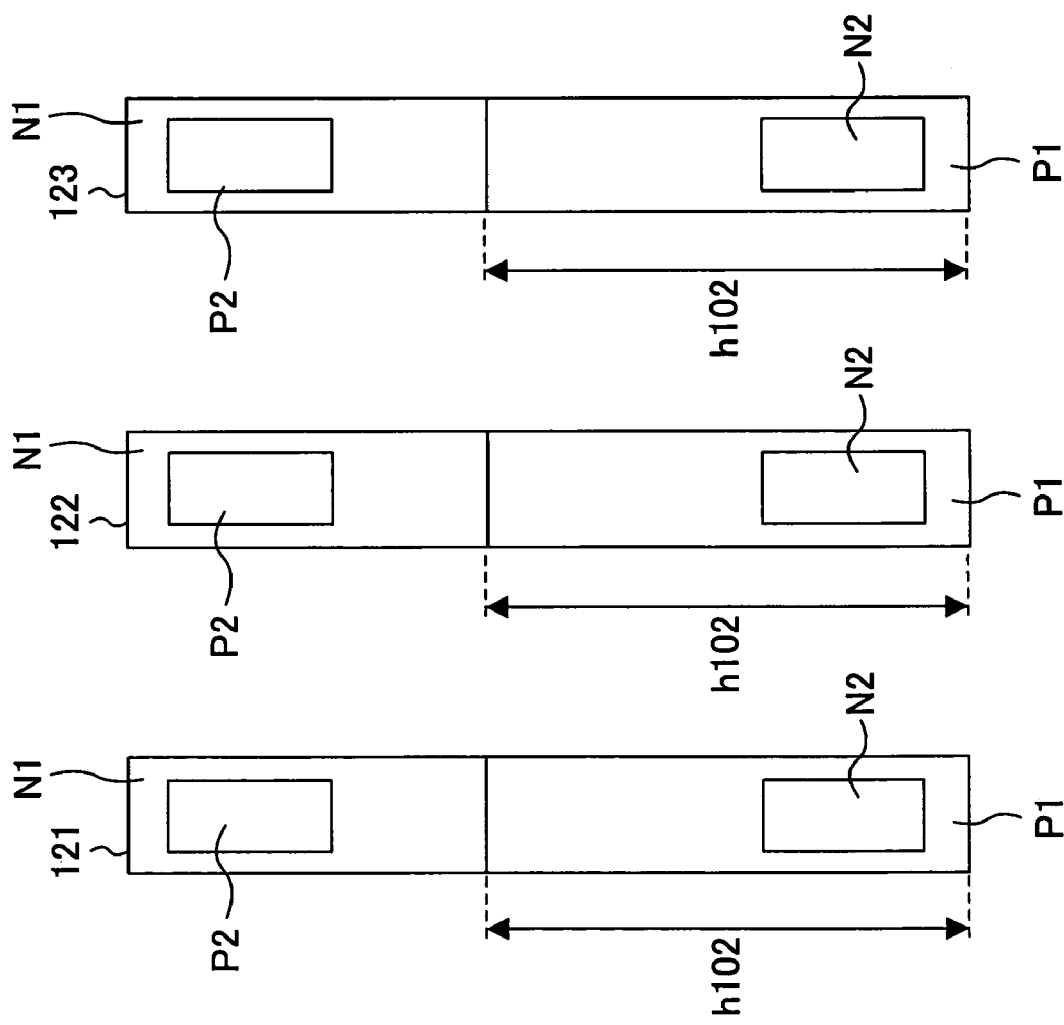
FIG. 10 is a layout diagram illustrating standard cells having a low level of performance and a well height h102.

FIG. 10 illustrates standard cells which comprise a low-performance transistor and has a well height h102. In FIG. 10, a standard cell 121 has the same function and performance as those of the standard cell 104, a standard cell 122 has the same function and performance as those of the standard cell 105, and a standard cell 123 has the same function and performance as those of the standard cell 108.

In this example, standard cell replacement is considered with respect to the standard cells 104, 105, and 108 in the placement diagram of FIG. 4 which is after completion of the standard cell placing step S101, and in step S201, the standard cell 104 is replaced with the standard cell 121, and the standard cell 105 is replaced with the standard cell 122.

Figure 11:
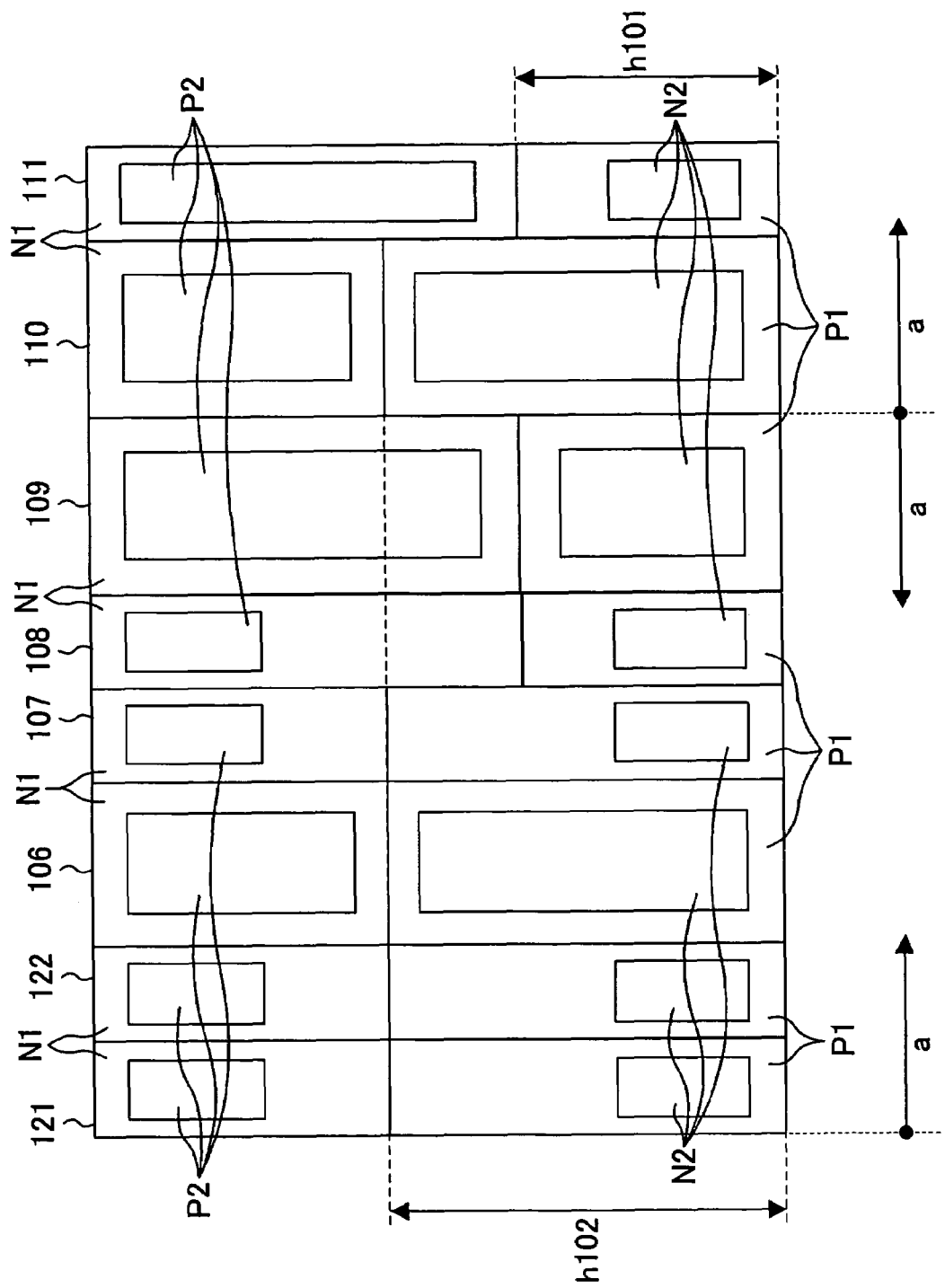
FIG. 11 is a placement diagram illustrating the semiconductor device at the time when standard cell change is completed in step S201.

FIG. 11 is a placement diagram illustrating the semiconductor device at the time when the well border line height change has been completed in step S201. In FIG. 11, the standard cell 104 is replaced with the standard cell 121, and the standard cell 105 is replaced with the standard cell 122, so that a standard cell contiguous portion having different well heights between the standard cells 105 and 106, which was present before the change, is eliminated.

Next, the process goes to the placement changing step S202. In step S202, each standard cell is exchanged with another standard cell in terms of placement within a predetermined reference.

Here, the predetermined reference is determined based on a design rule, a process parameter, the pros and cons of a wiring step after the placement, and the like in the semiconductor device. Specifically, when it is recognized that the wiring step after the placement does not have a problem on a design rule, and also that a change in performance of the semiconductor device after the wiring step falls within an acceptable range, a change is performed in the placement.

Also, in order to simplify the placement changing step S202, it may be considered as to whether or not the wiring step can be performed, whether or not a degradation in performance falls within an acceptable range, and the like, and a range to be analyzed may be limited to a predetermined distance range, in which placement is changed.

The placement position exchange in step S202 is assumed to be performed only when the placement position exchange of standard cells minimizes the number of contiguous portions of standard cells having different well border line heights.

In this example, replacement with another standard cell is considered within a range of a distance a of FIG. 11 (a predetermined region).

Concerning the standard cell 121, it is considered as to whether or not a change in the placement position is performed within the range of the distance a, i.e., whether or not the standard cell 121 is exchanged with the standard cell 122 or the standard cell 106 in terms of their positions. In this case, even if the standard cell 121 is exchanged with either the standard cell 122 or the standard cell 106, the number of contiguous portions of standard cells having different well border line heights is not reduced. Therefore, the placement positions are not changed.

Similarly, concerning each standard cell, it is considered as to whether or not the placement position is changed. When it is considered as to whether or not a change in the placement position is performed for the standard cell 110, the standard cell 110 is exchanged with the standard cell 111 in terms of the placement positions.

Figure 12:
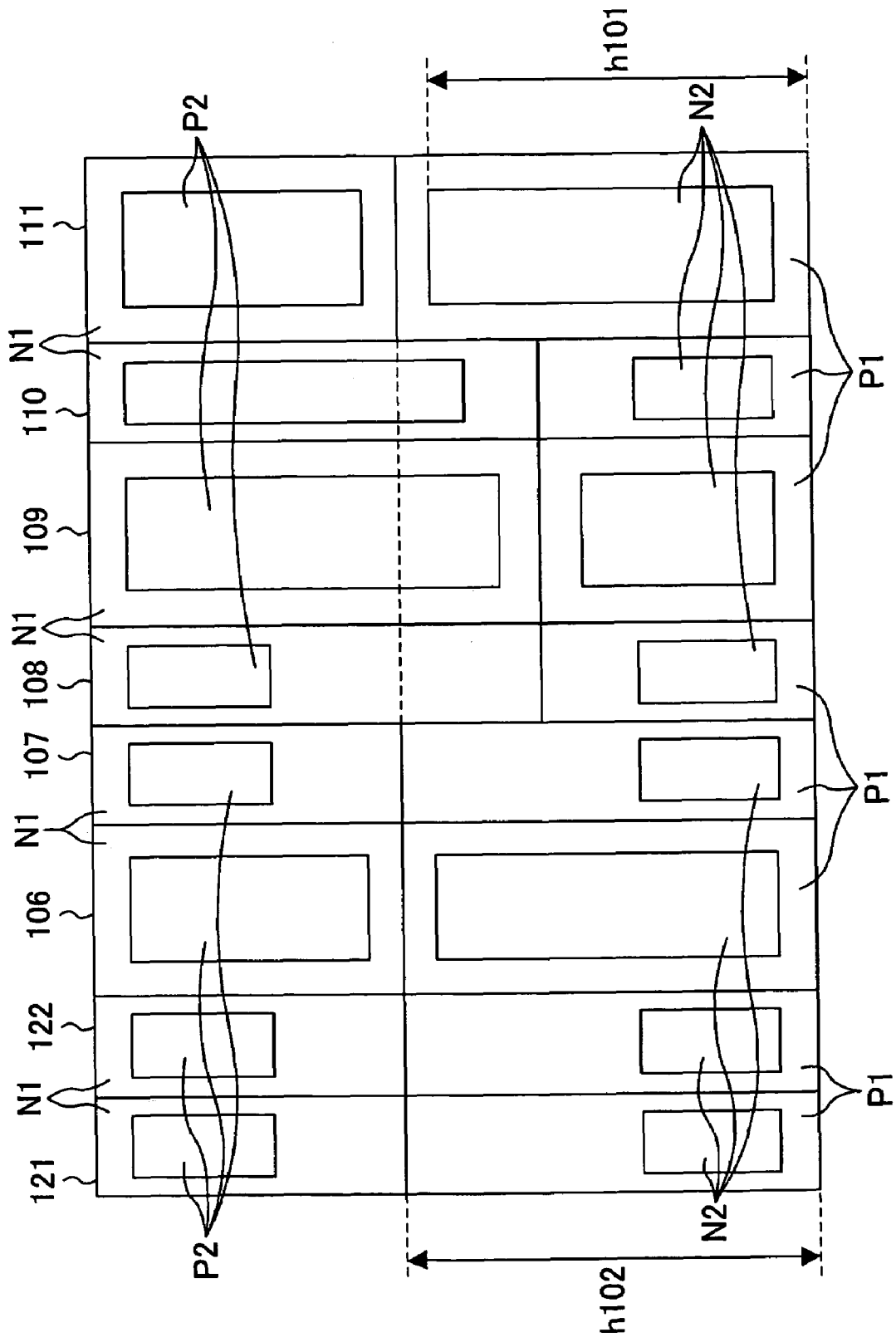
FIG. 12 is a placement diagram after placement position change is performed (step S202).

FIG. 12 is a placement diagram after the placement position change is performed. Due to the change, a contiguous portion of standard cells having different well border line height, which was present between the standard cell 109 and the standard cell 110, is eliminated.

Next, in step S102, replacement with a well height-converting standard cell is performed. In this example, the standard cell 108 is replaced with the standard cell 113.

Next, in step S103, insertion of the well height-converting standard cell is performed. In this example, the standard cell 114 is inserted between the standard cell 111 and the standard cell 110.

Figure 13:
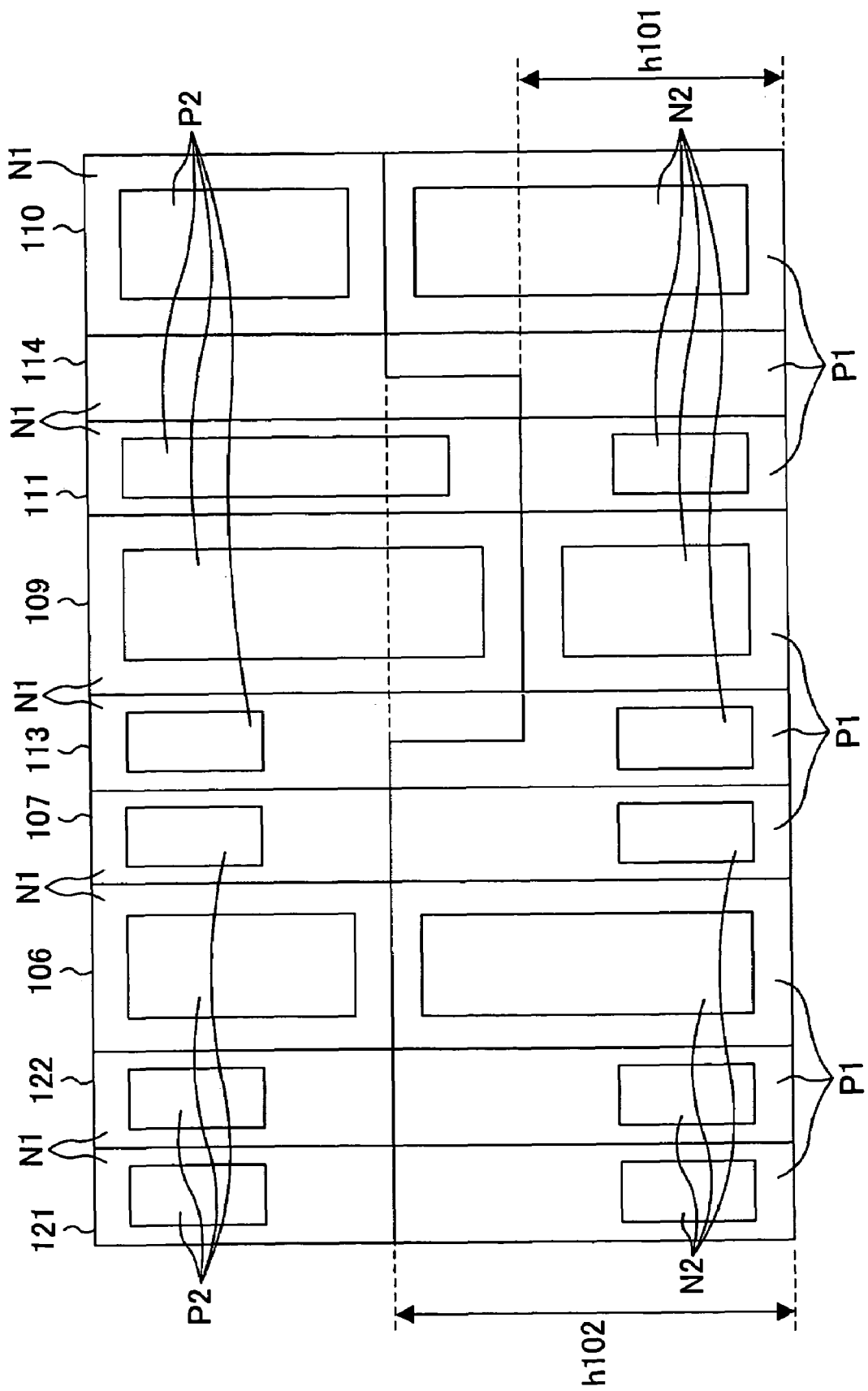
FIG. 13 is a placement diagram of a semiconductor device at the time when steps S102 and S103 have been completed.

FIG. 13 is a placement diagram of the semiconductor device at the time when steps S102 and S103 have been completed.

By increasing the standard cell height according to the semiconductor device placing method having the flow of this example of FIG. 9, the transistor speed performance is increased, and the well border line height is optimized in accordance with the logic of each standard cell, thereby minimizing the area of each standard cell. In addition, by providing a plurality of standard cells which convert a well border line height, the standard cells can be placed with high efficiency, thereby providing a semiconductor device having a high level of area efficiency. Particularly in this example, after initial placement, the number of well height-converting standard cells inserted is reduced by changing the placement so that the number of portions at which standard cells having different well heights are adjacent to each other is minimized, thereby providing a standard cell library having a satisfactory level of area efficiency, and a semiconductor device employing the standard cell library.

FIFTH EXAMPLE

Figure 14:
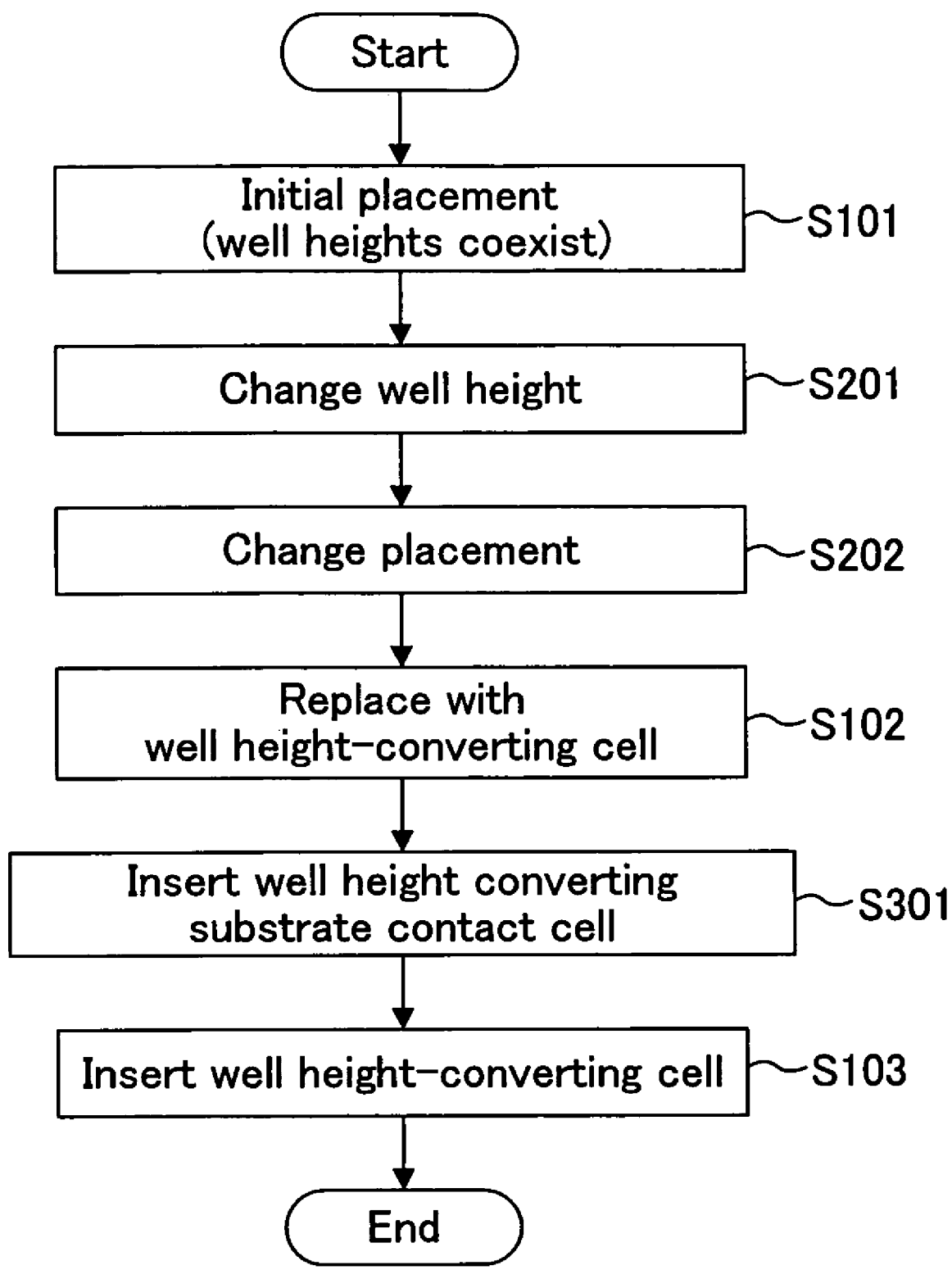
FIG. 14 is a flowchart illustrating a placing method for a semiconductor device according to a fifth example of the present invention.

FIG. 14 is a flowchart illustrating a placing method for a semiconductor device according to a fifth example of the present invention. In this example, an insertion step S301 of inserting a standard cell which converts a well border line height and comprises a substrate contact is added between the steps of S102 and S103 in the placing method of the fourth example of FIG. 9.

Figure 15:
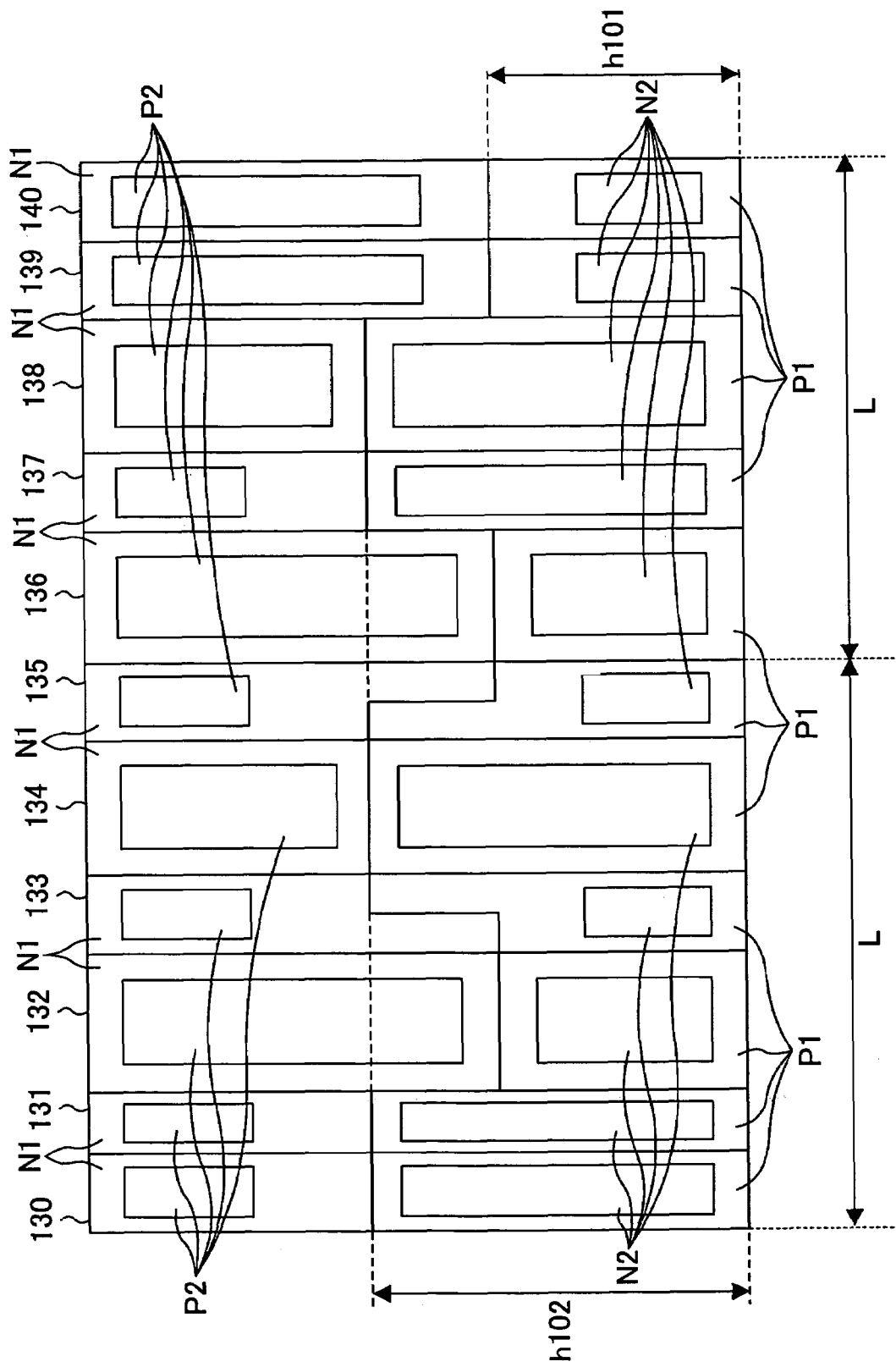
FIG. 15 is a placement diagram illustrating a semiconductor device just after step S102 is completed.

FIG. 15 is a placement diagram illustrating the semiconductor device of this example just after step S102 is completed.

In this example, standard cells 130 to 140 are standard cells which do not have a well contact which is a contact with respect to a substrate.

Since a standard cell 131 and a standard cell 132 adjacent to each other have different well border line heights, a design rule error occurs because a surrounding well region is not sufficiently provided. Similarly, a similar design rule error occurs between a standard cell 136 and a standard cell 137, and between a standard cell 138 and a standard cell 139.

Next, in step S301 (third standard cell inserting step), a well height-converting substrate contact standard cell (third standard cell) is inserted. As used herein, the well height-converting substrate contact standard cell refers to a standard cell which converts a well border line height so as to fit the well border line heights of other standard cells adjacent thereto on the left and right sides thereof, and comprises a well contact. In step S301 of this example, it is assumed that at least one substrate contact standard cell is inserted within a predetermined range. Specifically, as illustrated in FIG. 15, at least one substrate contact standard cell is inserted into an interval having a predetermined distance L (a predetermined region), thereby enhancing a power source line. Note that the distance L is determined, depending on target performance in design, a process parameter, or the like.

Figure 16:
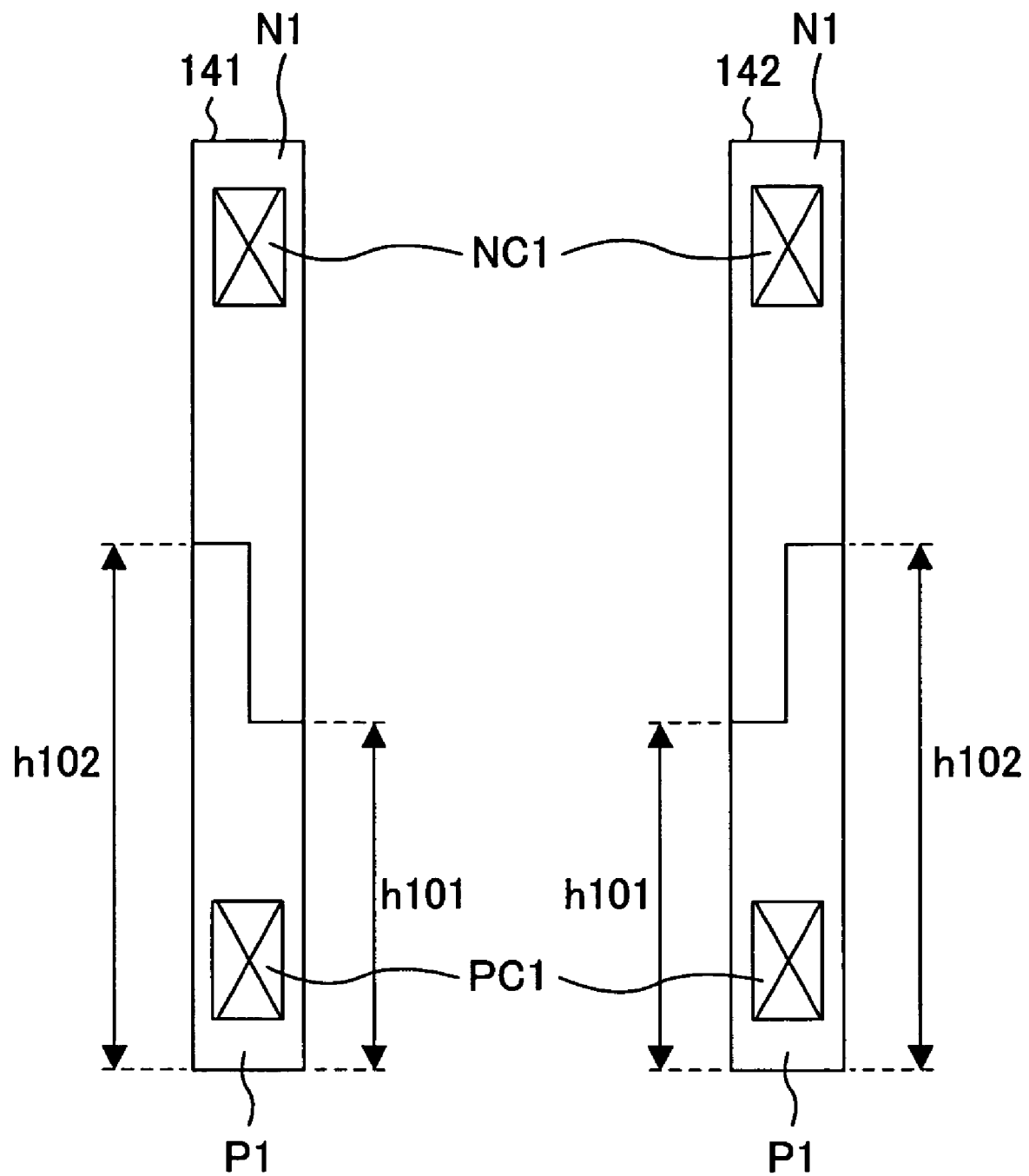
FIG. 16 is a layout diagram illustrating well height-converting substrate contact standard cells.

FIG. 16 is a layout diagram illustrating well height-converting substrate contact standard cells. A standard cell 141 has an N-well region N1 having a diffusion region NC1 for an N-well substrate contact and a P-well region P1 having a diffusion region PC1 for a P-well substrate contact, and has a height h102 (second height) at one side of the P-well region P1 and a height h101 (first height) at the other side of the P-well region P1. A standard cell 142 is obtained by mirror-reversing the standard cell 141 with respect to an imaginary axis extending in the height direction.

Figure 25A:
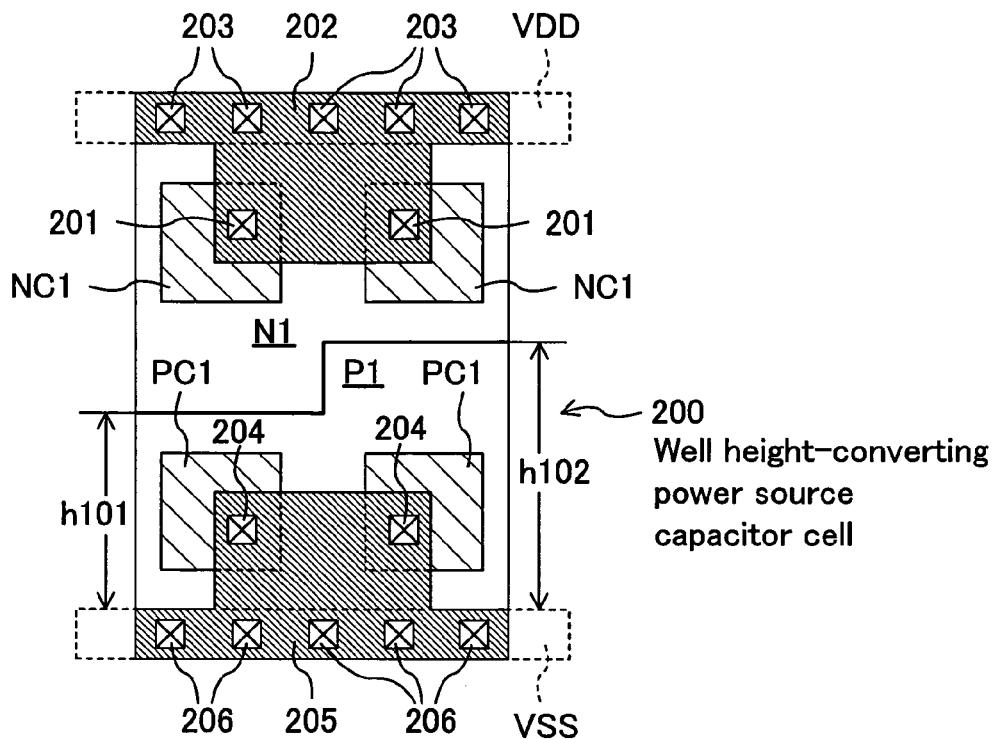
FIG. 25A is a diagram illustrating a specific layout structure of a well height-converting substrate contact cell.
Figure 25B:
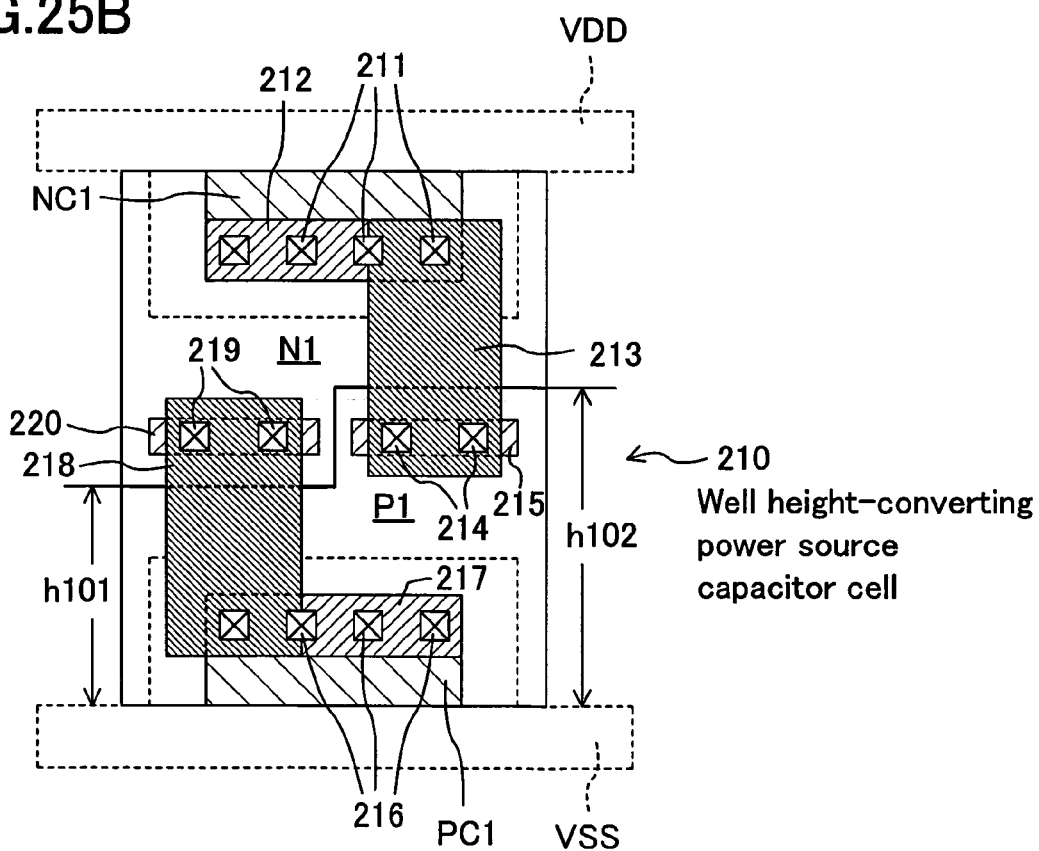
FIG. 25B is a diagram another specific layout structure of the well height-converting substrate contact cell.

FIGS. 25A and 25B illustrate a specific layout structure of a well height-converting substrate contact cell 200. The well height-converting substrate contact cell 200 of FIG. 25A is such that an intra-cell power source wiring line 202 is connected to two P-type diffusion regions NC1 for an N-well substrate contact which are provided in the N-well region N1 and are placed laterally side by side, through respective vias 201. The intra-cell power source wiring line 202 is connected to a power source wiring line VDD extending laterally in an upper portion in FIG. 25A of the substrate contact standard cell 200, through a via 203. Similarly, an intra-cell power source wiring line 205 is connected to two N-type diffusion regions PC1 for a P-well substrate contact which are placed laterally side by side, through a via 204. The intra-cell power source wiring line 205 is connected to a ground wiring line VSS extending in a lower portion in FIG. 25A of the substrate contact standard cell 200, through a via 206. The P-well region P1 has a height h102 (second height) at one side thereof and a height h101 (first height) at the other side thereof. A border line between the N-well region N1 and the P-well region P1 is provided in a region between the P-type diffusion region NC1 for an N-well substrate contact in the N-well region N1 and the N-type diffusion region PC1 for a P-well substrate contact in the P-well region P1.

A well height-converting substrate contact cell 210 of FIG. 25B is a standard cell which applies an arbitrary predetermined voltage which is different from a power source voltage on the power source wiring line or a ground voltage, as a substrate potential, to a substrate. In the substrate contact cell 210, a P-type diffusion region NC1 for a N-well substrate contact in an N-well region N1 is not connected to a power source wiring line VDD, and instead, is connected via four vias 211 to an upper-layer wiring line 212, and the line 212 is further connected via two vias 211 to an upper-layer wiring line 213, and the line 213 is connected via two vias 214 to a power source wiring line 215 for supplying a first predetermined voltage, so that the first predetermined voltage is supplied from the power source wiring line 215 to a substrate (N-well region N1). Similarly, an N-type diffusion region PC1 for a P-well substrate contact in a P-well region P1 is not connected to a ground wiring line VSS, and instead, is connected via four vias 216 to an upper-layer wiring line 217, and the wiring line 217 is further connected via two vias 216 to an upper-layer wiring line 218, and the wiring line 218 is connected via two via 219 to a power source wiring line 220 for supplying a second predetermined voltage, so that the second predetermined voltage is supplied from the power source wiring line 220 to a substrate (P-well region P1). The P-well region P1 has a height h102 (second height) at one side thereof and a height h101 (first height) at the other side thereof. A border line between the N-well region N1 and the P-well region P1 is provided in the P-type diffusion region NC1 for an N-well substrate contact in the N-well region N1 and the N-type diffusion region PC1 for a P-well substrate contact in the P-well region P1.

In FIG. 14, next, in step S301, the standard cell 141 is inserted between the standard cells 131 and 132 and the standard cell 142 is inserted between the standard cells 136 and 137 in accordance with an insertion principle in which a well height-converting substrate contact standard cell is inserted between adjacent standard cells having the different well border line heights h101 and h102 within an interval of the predetermined distance L.

Thereafter, in step S103, a well height-converting standard cell 115 is inserted between the standard cell 138 and the standard cell 139.

Figure 17:
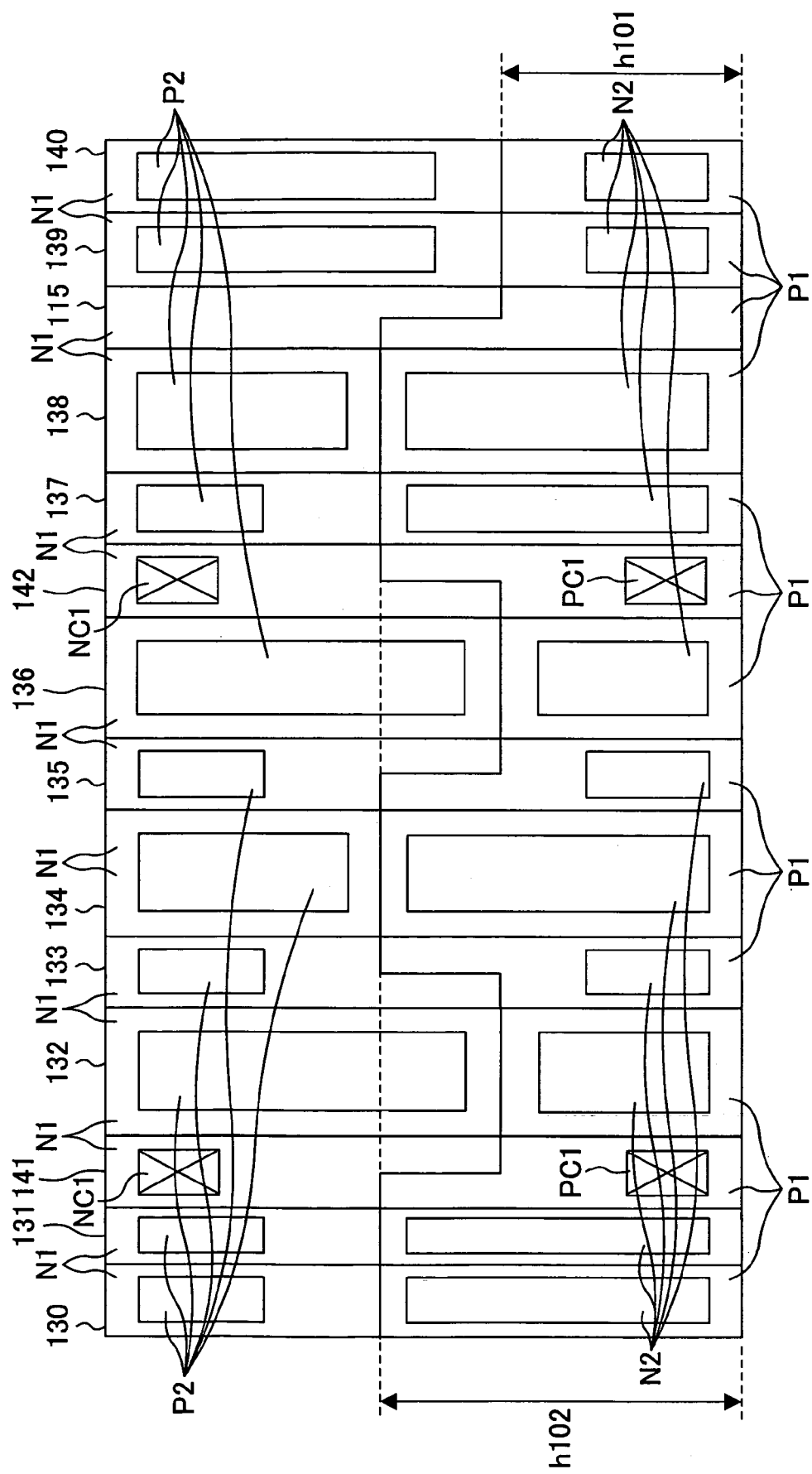
FIG. 17 is a placement diagram just after step S103 is completed.

FIG. 17 is a placement diagram of a semiconductor device just after step S103 is completed in this example.

By increasing the standard cell height according to the flow of this example, the transistor speed performance is increased, and the well border line height is optimized depending on the footprint of a transistor provided in accordance with the logic of each standard cell, thereby minimizing the area of each standard cell. Further, by providing a standard cell which converts a well border line height from one side thereof to the other side thereof, the standard cells can be placed with high efficiency, thereby providing a semiconductor device having an excellent level of speed performance and a high level of area efficiency. Furthermore, by inserting a standard cell having substrate contacts at appropriate intervals, it is possible to supply and control a substrate potential of a semiconductor device, thereby realizing a placing method for a semiconductor device which achieves a high level of performance and an area reduction.

In this example, it is assumed that the original standard cell has no substrate contact. Alternatively, assuming that a standard cell has a substrate contact, a substrate contact standard cell (sixth standard cell) having a well border line height h101 at both ends thereof or a substrate contact standard cell (seventh standard cell) having a height h102 can be placed within a predetermined distance range (a predetermined region) in order to enhance the substrate potential in a manner similar to that of this example, by providing a step of inserting a substrate contact standard cell having the height h101 at both ends thereof (sixth standard cell insertion step) or a step of inserting a substrate contact standard cell having the height h102 at both ends thereof (seventh standard cell insertion step) in step S301 of FIG. 14.

SIXTH EXAMPLE

Figure 18:
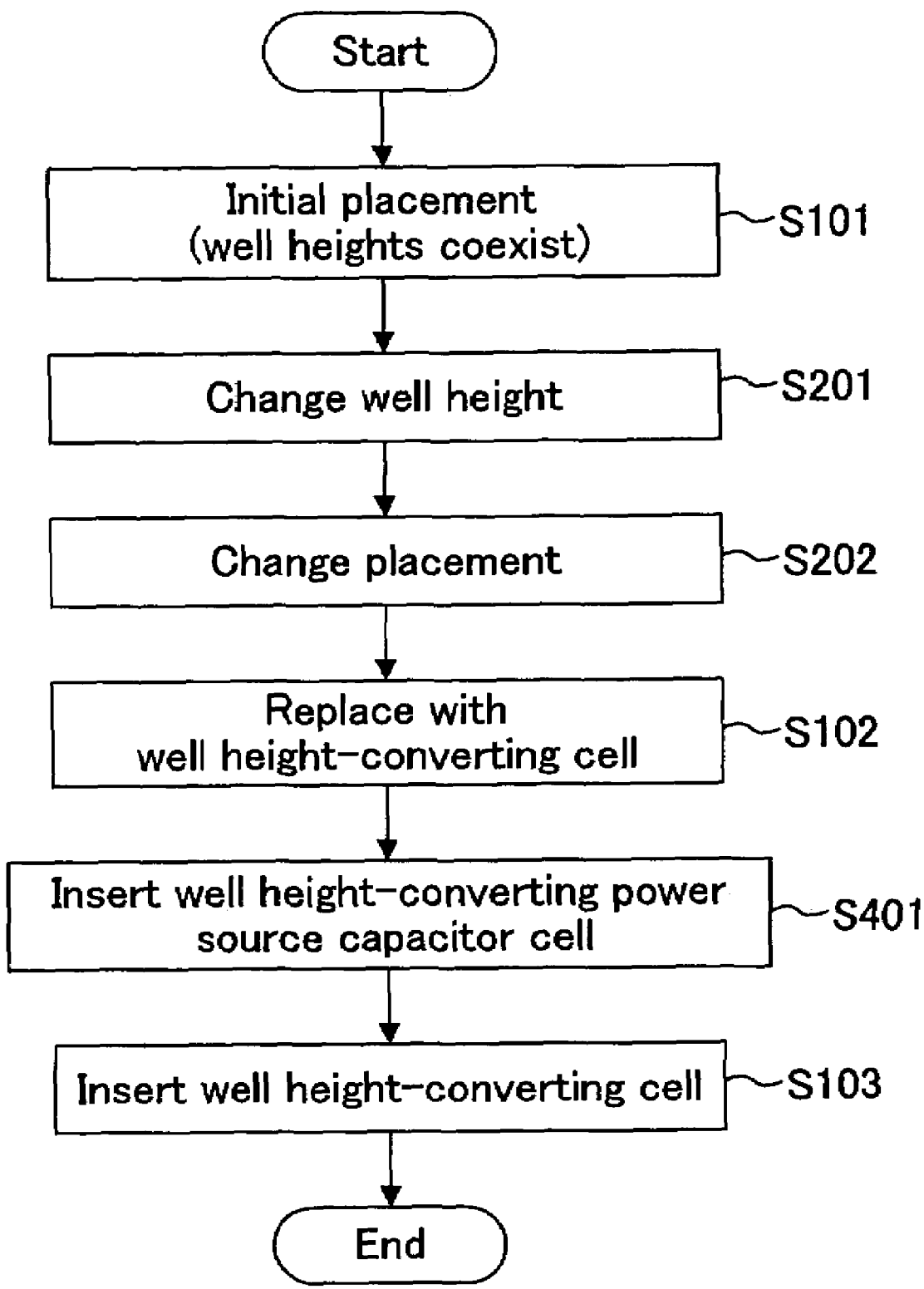
FIG. 18 is a flowchart illustrating a placing method for a semiconductor device according to a sixth example of the present invention.

FIG. 18 is a flowchart illustrating a placing method for a semiconductor device according to a sixth example of the present invention. In this example, a well heigh-converted power source capacitor cell insertion step S401 is added instead of the well height-converting substrate standard cell insertion step S301 of the fifth example. Here, a well height-converting power source capacitor cell is a standard cell (third standard cell) which converts a well border line height (as those of the first to fifth examples) and comprises a P-channel power source capacitor transistor and an N-channel power source capacitor transistor.

Figure 19:
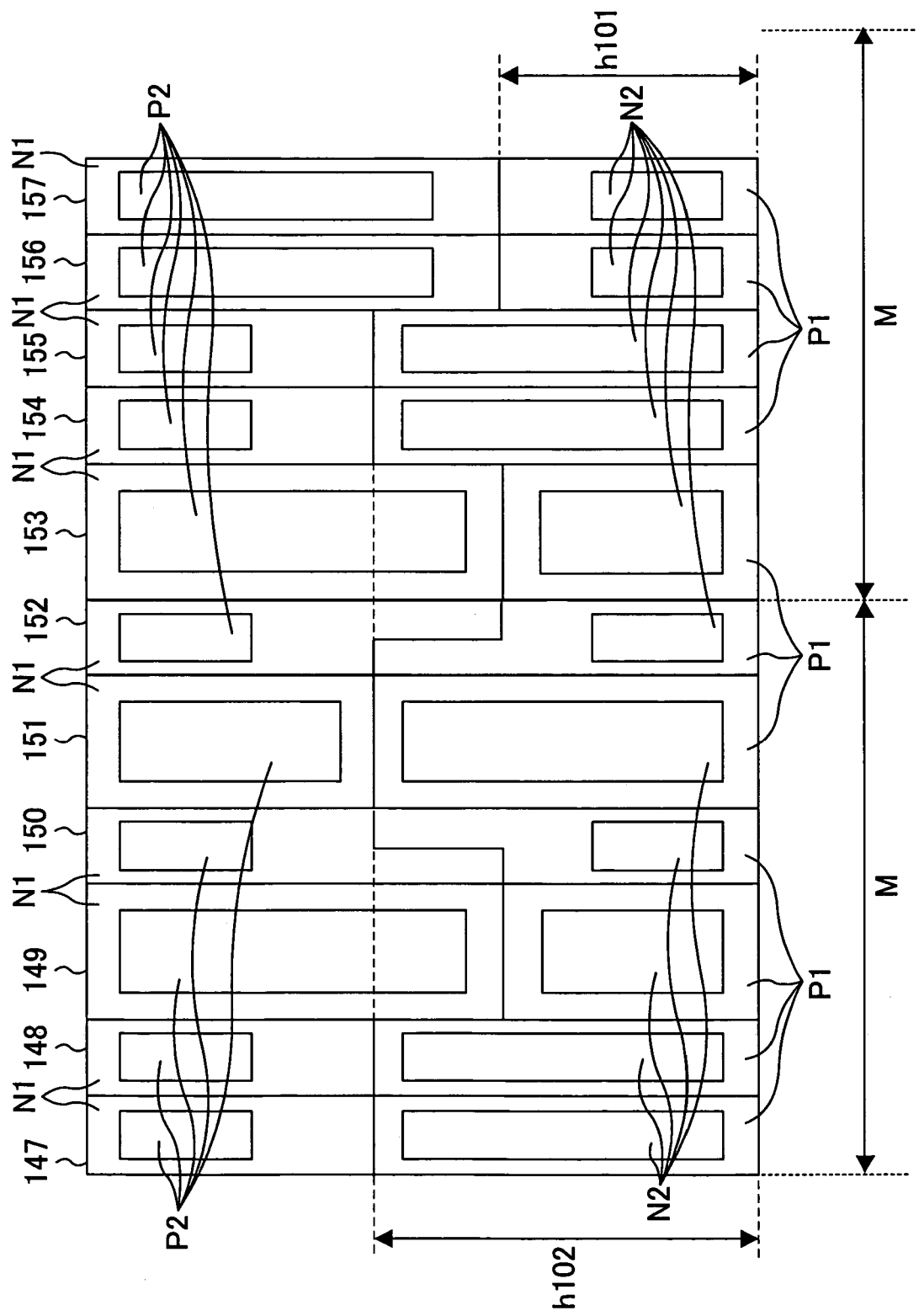
FIG. 19 is a placement diagram for a semiconductor device just after step S102 is completed.

FIG. 19 is a placement diagram for a semiconductor device just after step S102 is completed in this example. At this time, a standard cell 148 and a standard cell 149 which are of P well type and have different heights are adjacent to each other, a design rule error occurs because a surrounding well region is not sufficiently provided. Similarly, a similar design rule error occurs between a standard cell 153 and a standard cell 154, and a standard cell 155 and a standard cell 156.

Next, in step S401, a well height-converting power source capacitor cell is inserted. In step S401 of this example, at least one power source capacitor cell is inserted into a predetermined range, thereby enhancing a power source line. In this example, it is assumed that at least one power source capacitor cell is inserted into an interval of a predetermined distance M (a predetermined region). Note that, similar to the fifth example, even when conversion of a well border line height is not required, a standard cell which has a height h101 at both ends thereof and comprises a power source capacitor transistor (eighth standard cell) or a standard cell which has a height h102 at both ends thereof and comprises a power source capacitor transistor (ninth standard cell) can be provided at intervals of the predetermined distance M (eighth or ninth standard cell insertion steps) in step S401. Here, the distance M is determined, depending on target performance in design, a process parameter, or the like, is smaller than a distance which causes a degradation in performance due to an increase in consumed current during an operation, and is within an acceptable range.

Figure 20:
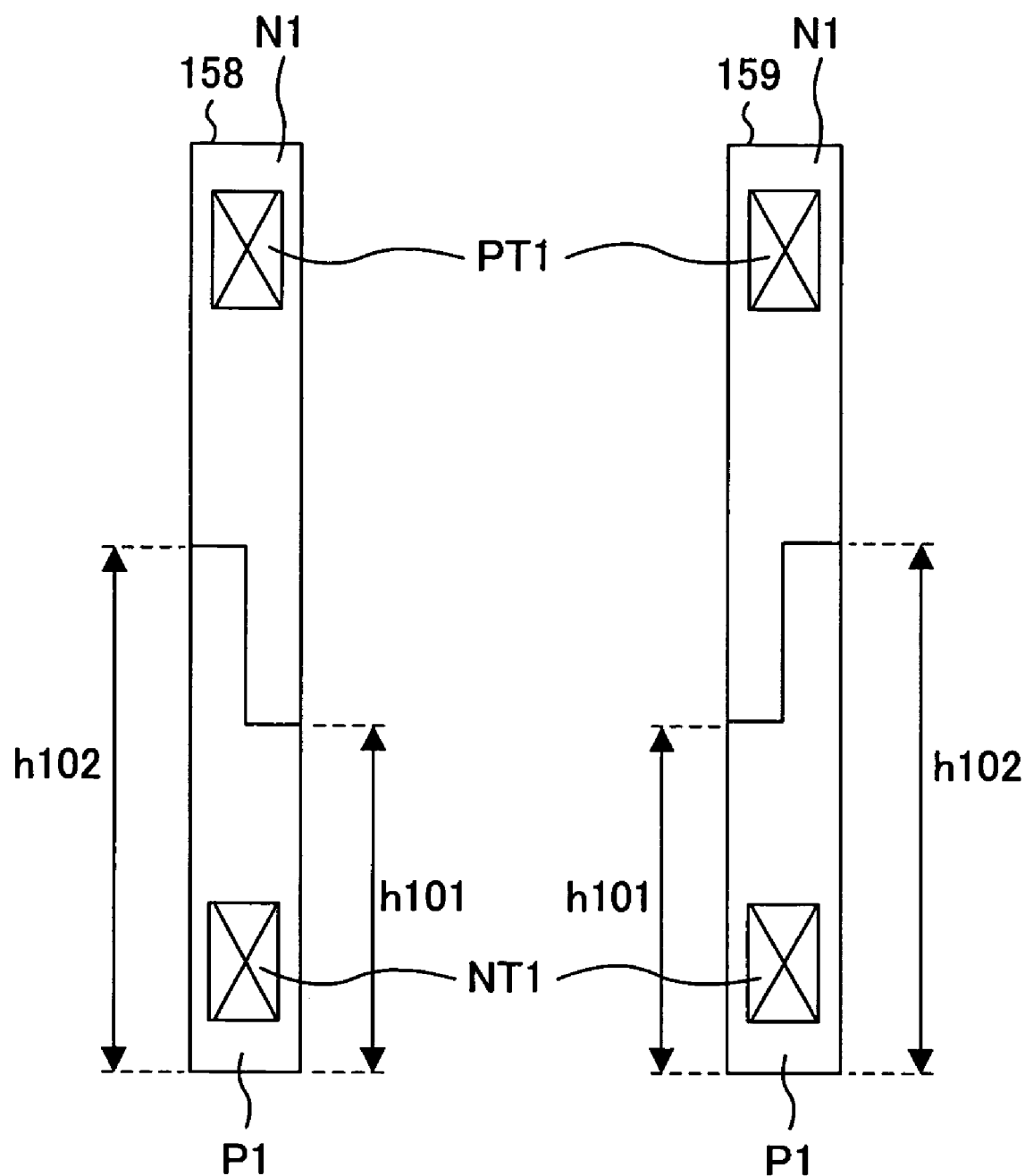
FIG. 20 is a layout diagram illustrating well height-converting power source capacitor cells.

FIG. 20 is a layout diagram illustrating well height-converting power source capacitor cells. The well height-converting power source capacitor cell 158 comprises a P-channel power source capacitor transistor PT1 formed in an N-well region N1 and an N-channel power source capacitor transistor NT1 formed in a P-well region P1, and has a well height h102 at one side of the P-well region P1 and a height h101 at the other side. A standard cell 159 is obtained by mirror-reversing the power source capacitor cell 158 with respect to an imaginary axis extending in the height direction.

Figure 26A:
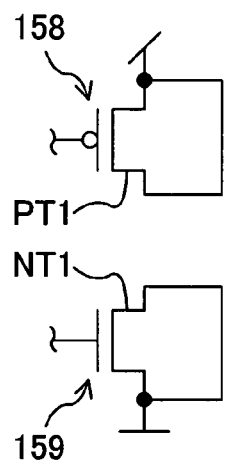
FIG. 26A is a circuit diagram illustrating a well height-converting power source capacitor cell.
Figure 26B:
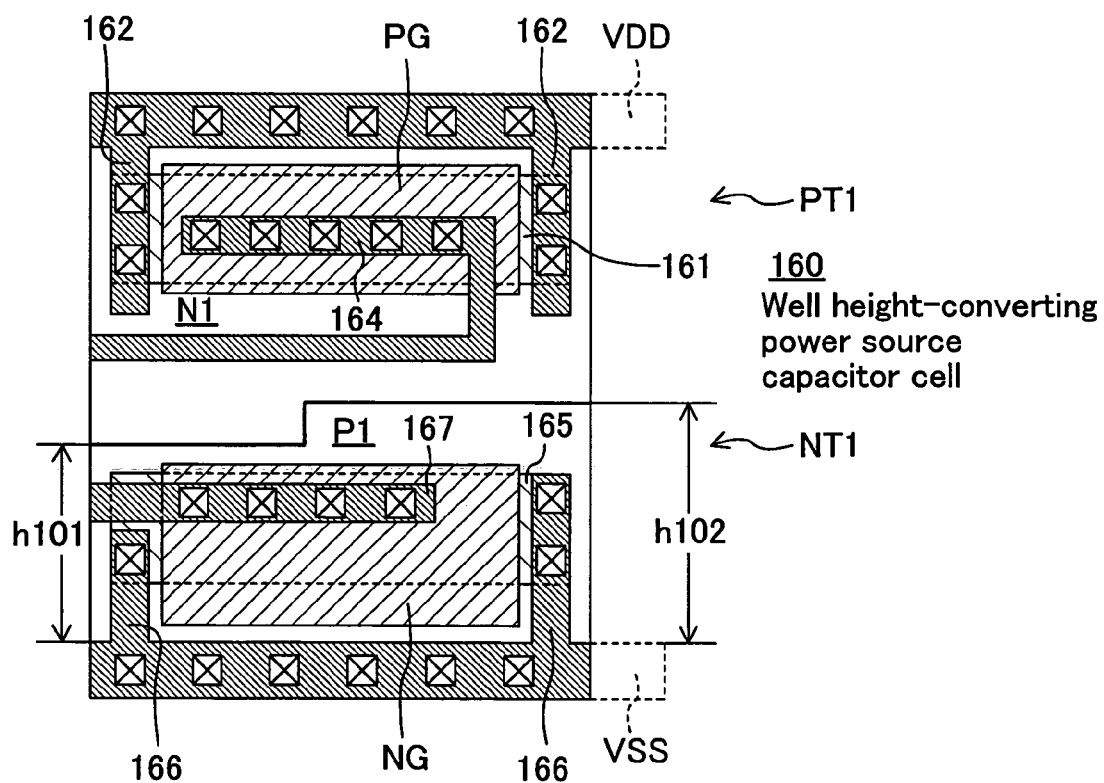
FIG. 26B is a specific layout structure of the well height-converting power source capacitor cell.

A circuit diagram and a layout structure of the well height-converting power source capacitor cells 158 and 159 are illustrated in FIGS. 26A and 26B. The power source capacitor cell 158 of FIG. 26A has a P-channel power source capacitor transistor PT1 whose source and drain are connected to a power source and to whose gate a ground voltage (L level) is input. On the other hand, a source and a drain of an N-channel power source capacitor transistor NT1 of the power source capacitor cell 159 of FIG. 26A are grounded, and a predetermined voltage (H level) is input to a gate thereof. The specific layout structure of FIG. 26B indicates a power source capacitor cell 160 in which the two power source capacitor cells 158 and 159 are integratedly constructed. Concerning the power source capacitor cell 160, in a P-channel power source capacitor transistor PT1 formed in an N-well region N1, left- and right-hand P-type diffusion regions 161 are connected via a wiring line 162 to a power source wiring line VDD which is provided above the power source capacitor cell 160, a wiring line 164 is connected to a gate PG, and a predetermined voltage (L level) is applied to the wiring line 164. On the other hand, in an N-channel power source capacitor transistor NT1 formed in the P-well region P1, left- and right-hand N-type diffusion regions 165 are connected via a wiring line 166 to a ground wiring line VSS provided below the power source capacitor cell 160, a wiring line 167 is connected to a gate NG, and a predetermined voltage (H level) is applied to the wiring line 167. In addition, the P-well region P1 has a height h102 (second height) at one side thereof and a height h101 (first height) at the other side thereof.

In FIG. 18, next, in step S401, the standard cell 158 is inserted between the standard cells 148 and 149, and the standard cell 159 is inserted between the standard cells 153 and 154, in accordance with the insertion principle of the fourth example.

Thereafter, in step S103, the well height-converting standard cell 115 is inserted between the standard cell 155 and the standard cell 156.

Figure 21:
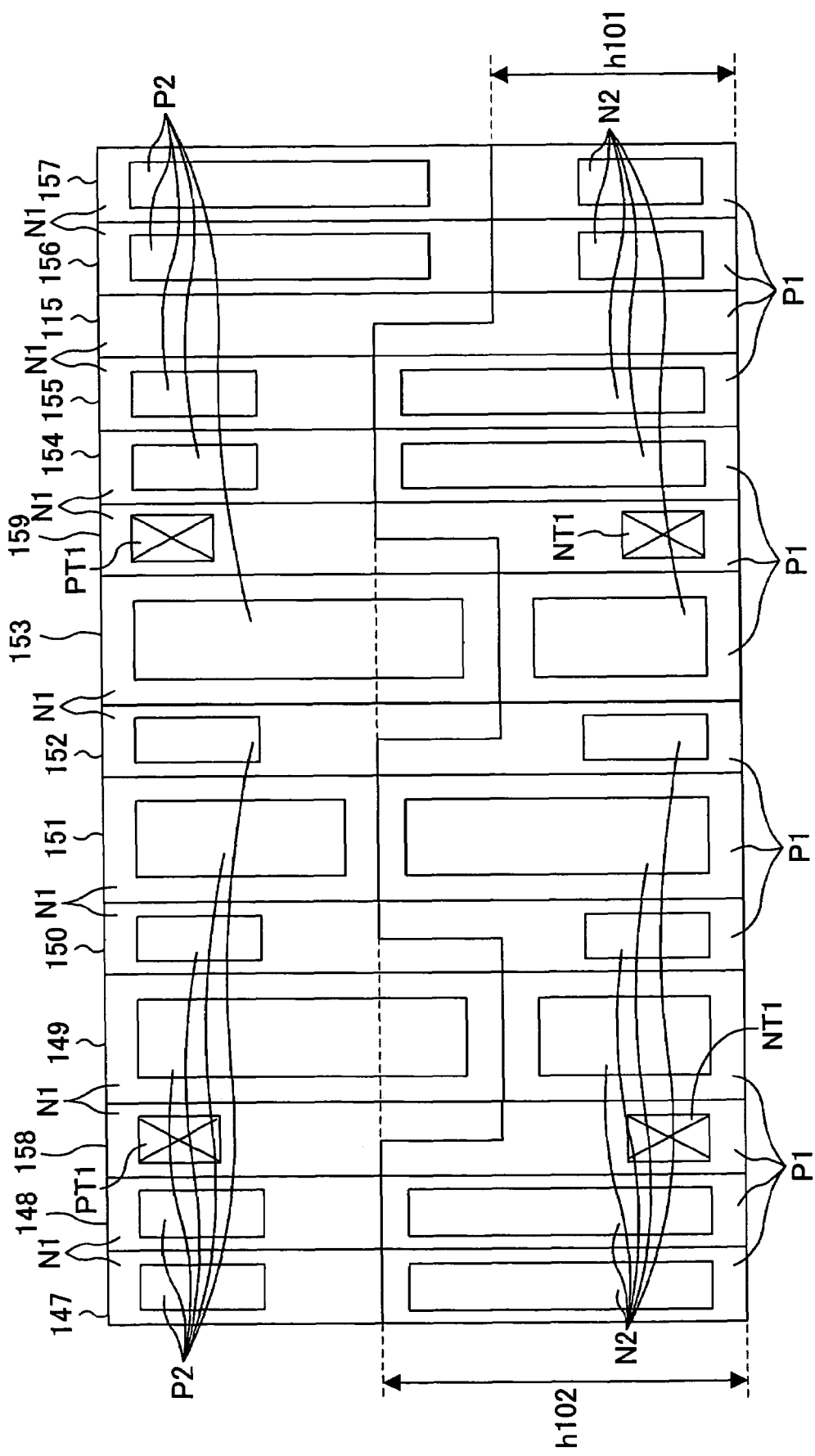
FIG. 21 is a placement diagram for a semiconductor device just after step S103 is completed.

FIG. 21 is a placement diagram just after step S103 is completed in this example.

By increasing the standard cell height according to the flow of this example, the transistor speed performance is increased, and the well border line height is optimized depending on the footprint of a transistor provided in accordance with the logic of each standard cell, thereby minimizing the area of each standard cell. Further, by providing a standard cell which converts a well border line height from one side thereof to the other side thereof, the standard cells can be placed with high efficiency, thereby providing a semiconductor device having an excellent level of speed performance and a high level of area efficiency. Furthermore, by inserting power source standard cells at appropriate intervals, it is possible to prevent occurrence of a degradation in performance due to an increase in consumed current during an operation, thereby realizing a placing method for a semiconductor device which achieves a high level of performance and an area reduction.

SEVENTH EXAMPLE

Figure 22:
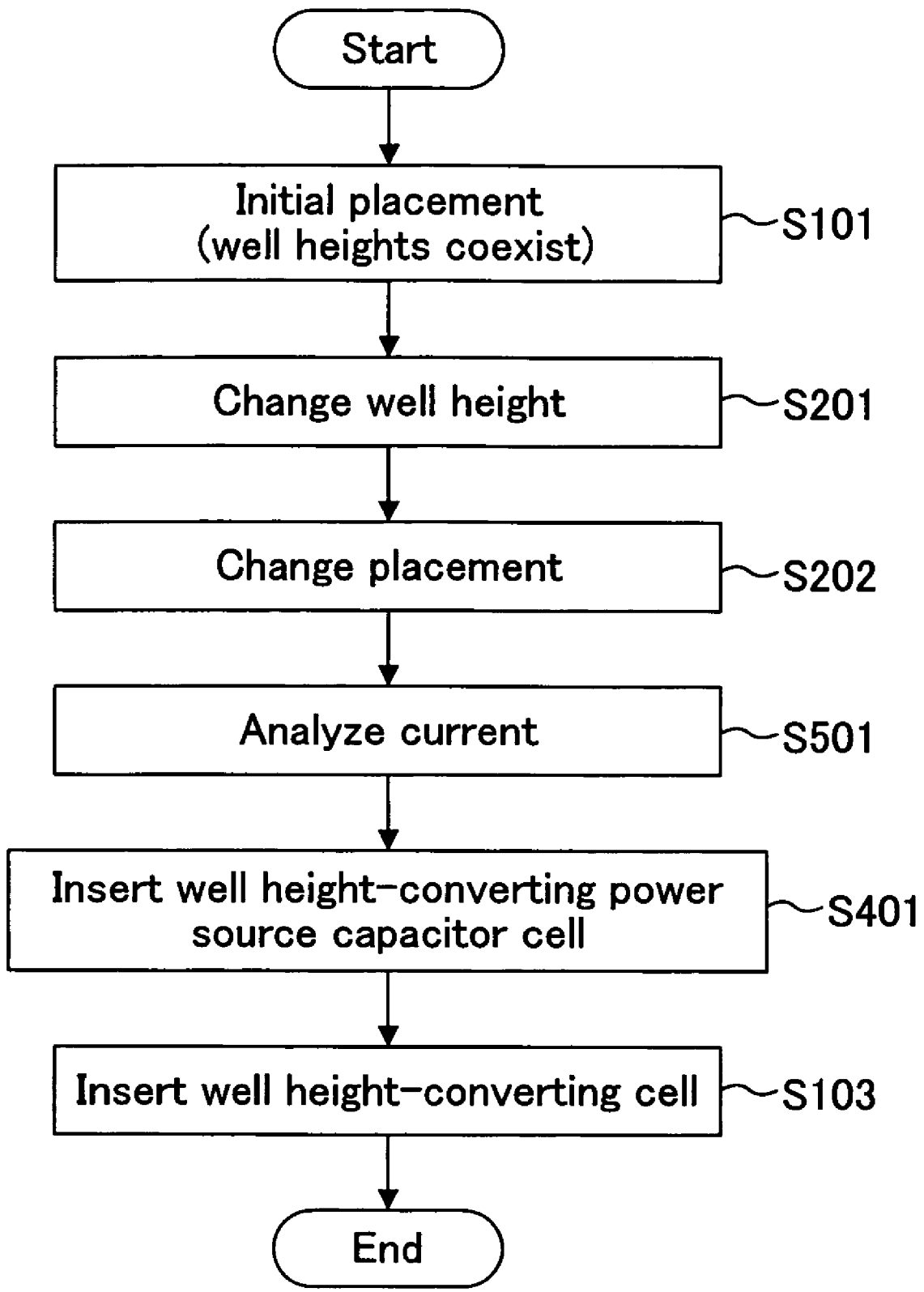
FIG. 22 is a flowchart illustrating a placing method for a semiconductor device according to a seventh example of the present invention.

FIG. 22 is a flowchart illustrating a placing method for a semiconductor device according to a seventh example of the present invention. In this example, a consumed current analyzing step S501 is added instead of step S102 of performing replacement with a well height-converting cell in the sixth example.

Figure 23:
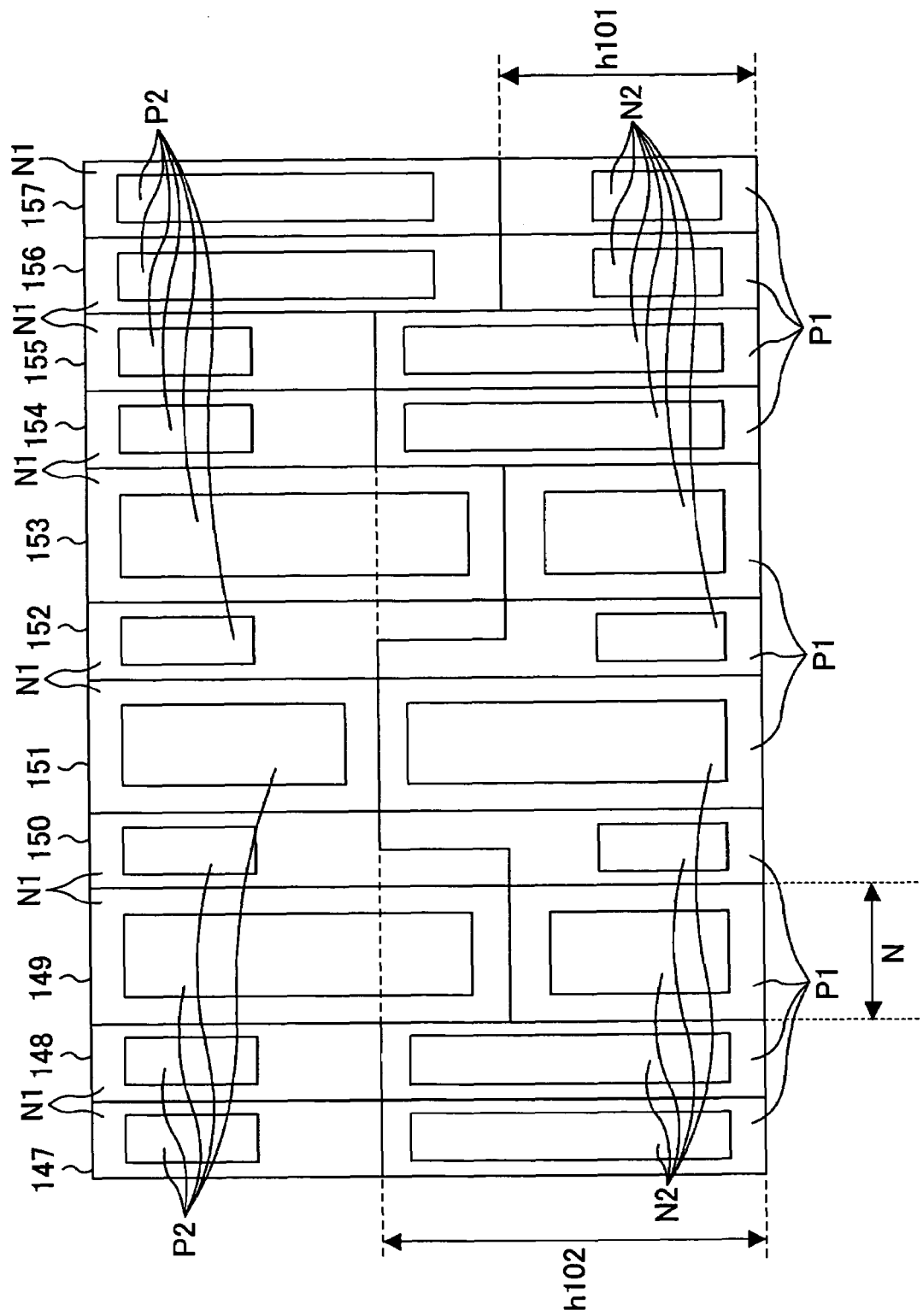
FIG. 23 is a placement diagram for a semiconductor device just after step S202 is completed.

FIG. 23 is a placement diagram for a semiconductor device just after step S202 of changing placement for a reduction in the number of portions at which standard cells having different well border line heights are adjacent to each other.

At this time, since a standard cell 148 and a standard cell 149 adjacent to each other have different well border line heights, a design rule error occurs because a surrounding well region is not sufficiently provided. Similarly, a similar design rule error occurs between a standard cell 153 and a standard cell 154, and between a standard cell 155 and a standard cell 156.

Next, in step S501, consumed current analysis is performed. By the analysis in step S501, the placement position of the power source capacitor cell is determined. Specifically, in the consumed current analyzing step S501, an activation rate and current performance of a transistor possessed by the standard cell are analyzed based on the placement diagram of FIG. 23. In this example, assuming that a region in the vicinity of the standard cell 149 of FIG. 23 is a region in which a consumed current exceeds a predetermined reference value, it is determined that a power source capacitor cell needs to be placed in a region having a range N.

Next, in step S401 (third standard cell inserting step), a well height-converting power source capacitor cell (third standard cell) is inserted. In step S401 of this example, a power source capacitor cell which converts a well border line height is inserted in accordance with the result of the analysis performed in step S501. In this example, since the region having the range N of FIG. 23 is determined as the placement position, the power source capacitor cell is inserted into the region.

Note that the range N is a distance which is determined, depending on target performance in design, a process parameter, or the like. The distance is such that, by providing a power source capacitor cell within the range N, a degradation in performance due to an increase in consumed current during an operation falls within an acceptable range.

In step S401, the standard cell 158 is inserted between the standard cells 148 and 149 in accordance with an insertion principle in which a well height-converting power source capacitor cell is inserted between adjacent standard cells having the different well border line heights h101 and h102 within the range N.

Thereafter, in step S103, the well height-converting standard cell 114 is inserted between the standard cells 153 and 154, and the standard cell 115 is inserted between the standard cells 155 and 156.

FIG. 24 is a placement diagram just after step S103 is completed in this example.

By increasing the standard cell height according to the flow of this example, the transistor speed performance is increased, and the well border line height is optimized depending on the footprint of a transistor provided in accordance with the logic of each standard cell, thereby minimizing the area of each standard cell. Further, by providing a standard cell which converts a well border line height from one side thereof to the other side thereof, the standard cells can be placed with high efficiency, thereby providing a semiconductor device having an excellent level of speed performance and a high level of area efficiency. Furthermore, by inserting a power source standard cell at an appropriate position based on consumed current analysis, it is possible to prevent occurrence of a degradation in performance due to an increase in consumed current during an operation, thereby realizing a placing method for a semiconductor device which achieves a high level of performance and an area reduction.

EIGHTH EXAMPLE

Next, an eighth example of the present invention will be described. Although the substrate contact cell and the power source capacitor cell described in FIGS. 25A, 25B, 26A, and 26B have been described as standard cells which convert a well height in the fifth and sixth examples, an antenna cell and a feed cell are employed in this another example.

Figure 27:
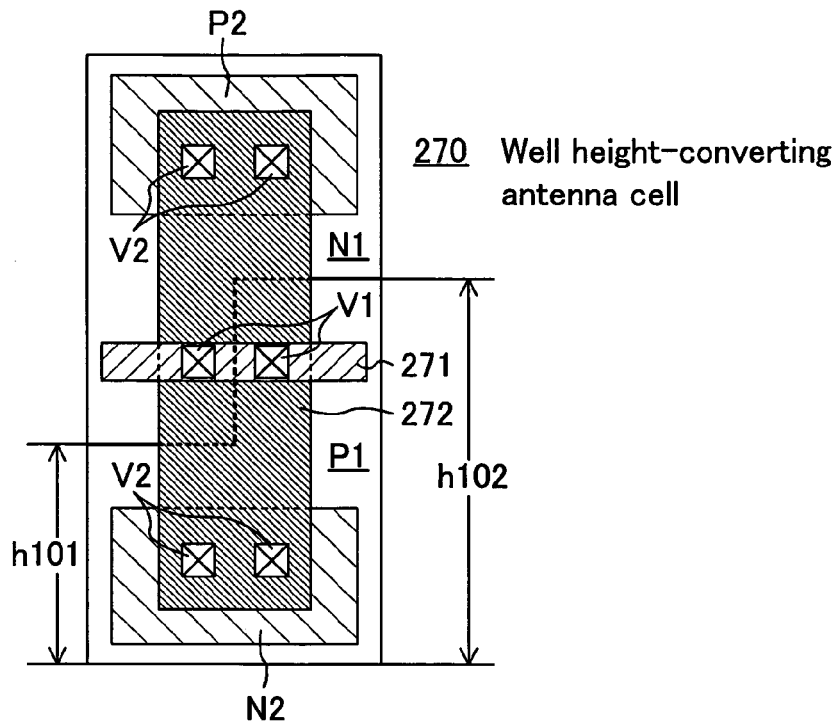
FIG. 27 is a diagram illustrating a specific layout structure of a well height-converting antenna cell.

FIG. 27 illustrates a well height-converting antenna cell 270. As used herein, the term "antenna action" indicates that, when wiring layers are successively formed from a lower layer during LSI production, a wiring line connected to a gate of a transistor may be floating since an upper-layer wiring line layer is not yet formed, and in this case, when the floating wiring line is subjected to plasma etching or the like, the floating wiring line functions as an antenna for collecting charge. When the charge accumulated in the floating wiring line due to the antenna action exceeds a threshold, the transistor connected thereto is broken down. Therefore, it is necessary that a floating wiring line be divided or a floating wiring line exceeding the threshold be grounded via a diode in order to prevent the transistor breakdown.

The antenna cell 270 of FIG. 27 has a structure such that a floating wiring line exceeding the threshold is grounded via a diode in order to suppress the antenna action. Specifically, the well height-converting antenna cell 270 of FIG. 27 has a floating wiring line 271 which exceeds the threshold. The wiring line 271 is connected through a via V1 to a wiring line 272 in an underlying layer. Further, the wiring line 272 is connected, through a via V2, a P-type diffusion region P2 for diode formation, and an N-type diffusion region N2 for diode formation, to a substrate (an N-well region N1 and a P-well region P1). The P-well region P1 has a height h102 (second height) at one side thereof and a height h101 (first height) at the other side thereof, and a border line between the P-well region P1 and the N-well region N1 is placed in a region other than the P-type diffusion region P2 for diode formation and the N-type diffusion region N2 for diode formation. Although both the P-type diffusion region P2 and the N-type diffusion region N2 are formed as diffusion regions for diode formation in FIG. 27, only either of them may be formed. Also, although the floating wiring line 271 is connected between the vias V2 in FIG. 27, the floating wiring line 271 may not be connected between the vias V2 in order to reduce the floating wiring line capacitance.

Figure 28:
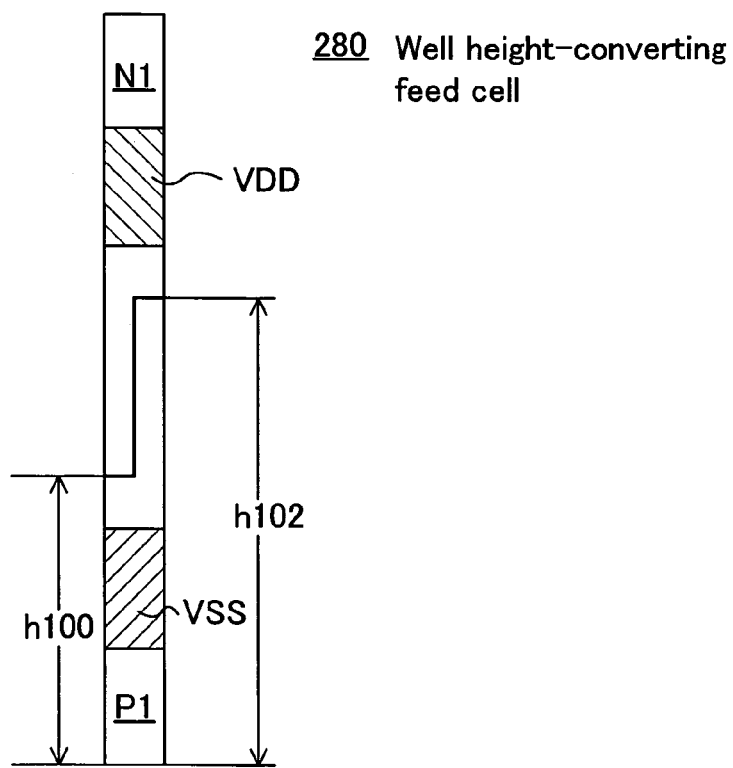
FIG. 28 is a diagram illustrating a specific layout structure of a well height-converting feed cell.

FIG. 28 illustrates a specific layout structure of a well height-converting feed cell. The feed cell 280 of FIG. 28 is a standard cell which is placed in, for example, a region having complication of wiring lines in order to obtain a wiring line region, and in whose N-well region N1 and P-well region P1 a diffusion region is not formed. Also, the P-well region P1 has a height h102 (second height) at one side thereof and a height h101 (first height) at the other side thereof, and a border line between the P-well region P1 and the N-well region N1 is arbitrarily set between the P-well region P1 and the N-well region N1. Note that, in the feed cell 280 of FIG. 28, a power source wiring line VDD and a ground wiring line VSS extending to the left- and right-hand ends thereof are formed therein in order to stabilize a power source voltage and a ground voltage.

Figure 29A:
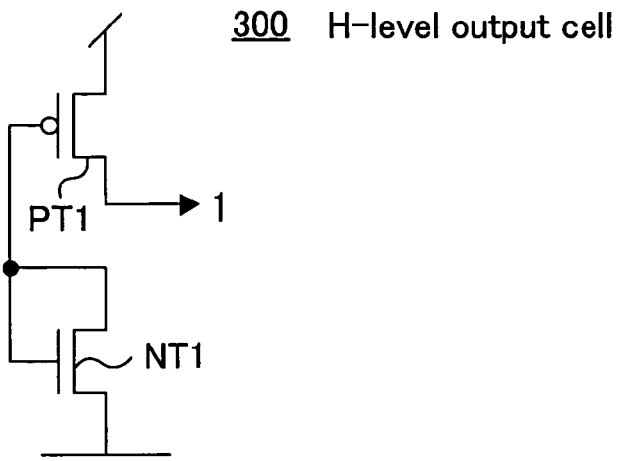
FIG. 29A is a circuit diagram illustrating a well height-converting H-level output cell.
Figure 29B:
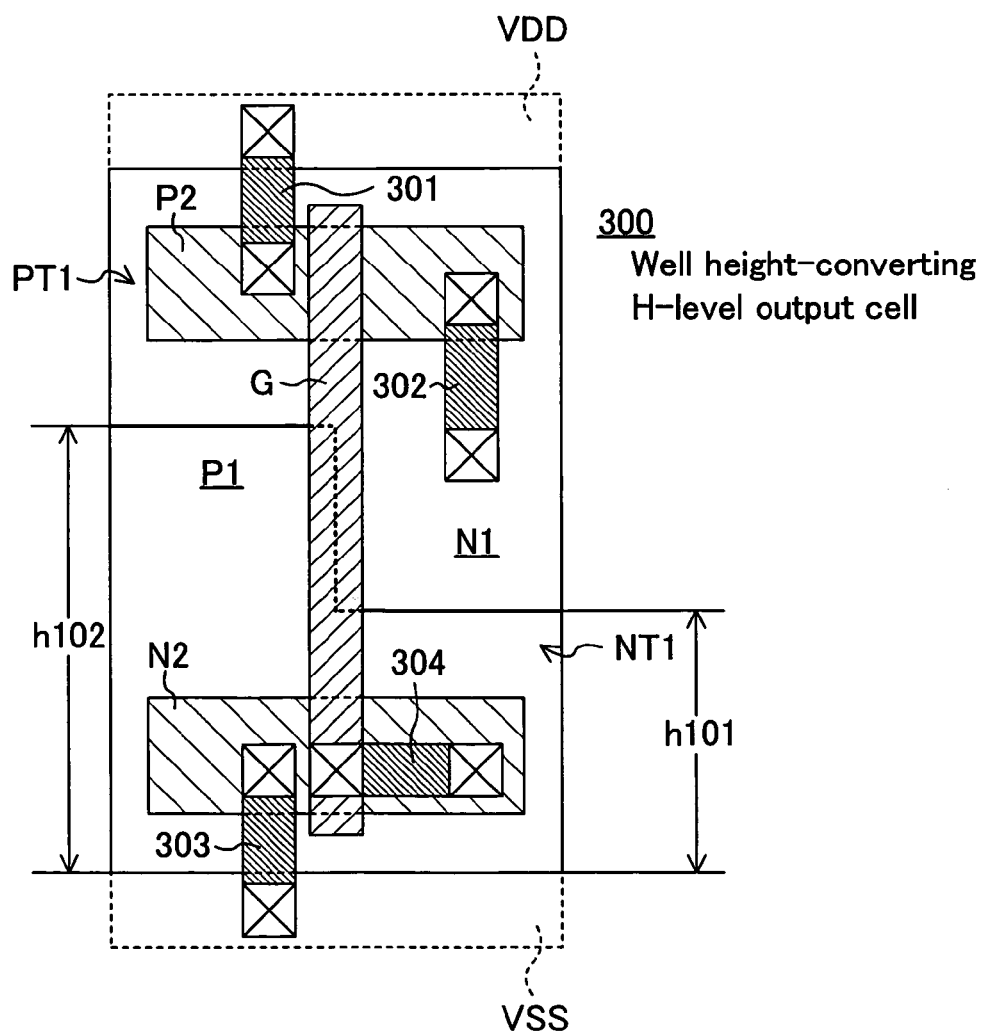
FIG. 29B is a specific layout structure of the well height-converting H-level output cell.

FIGS. 29A and 29B illustrate a circuit diagram and a specific layout structure of a well height-converting H-level output cell. The H-level output cell 300 of FIGS. 29A and 29B is a standard cell which has a function of constantly outputting logic "1" (H level). In the H-level output cell 300 of FIG. 29A, a P-type transistor PT1 receives a power source voltage at a source thereof, outputs logic "1" from a drain thereof, and is connected via a gate thereof to a drain and a gate of an N-type transistor NT1. The N-type transistor NT1 is connected via a source thereof to the ground. The H-level output cell 300 has a specific layout structure as illustrated in FIG. 29B such that gates of the P-type and N-type transistor PT1 and NT1 are a common gate G, a P-type diffusion region P2 on a left side in FIG. 29B of the common gate G of the P-type transistor PT1 is connected via a wiring line 301 to a power source wiring line VDD above the cell 300, and a P-type diffusion region P2 on a right side in FIG. 29B of the common gate G is an output terminal which outputs logic "1" (H level) via a wiring line 302. On the other hand, an N-type diffusion region N2 on a left side in FIG. 29B of the common gate G of the N-type transistor NT1 is connected via a wiring line 303 to a ground wiring line VSS below the cell 300, and an N-type diffusion region N2 on a right side in FIG. 29B of the common gate G is connected via a wiring line 304 to the common gate G. Also, the P-well region P1 has a height h102 (second height) at one side thereof and a height h101 (first height) at the other side thereof, and a border line between the P-well region P1 and the N-well region N1 is placed between the P-type diffusion region P2 of the P-type transistor PT1 and the N-type diffusion region N2 of the N-type transistor NT1.

Figure 30A:
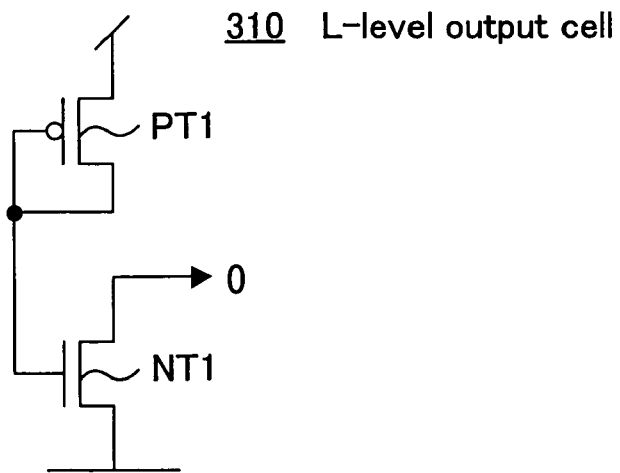
FIG. 30A is a circuit diagram illustrating a well height-converting L-level output cell.
Figure 30B:
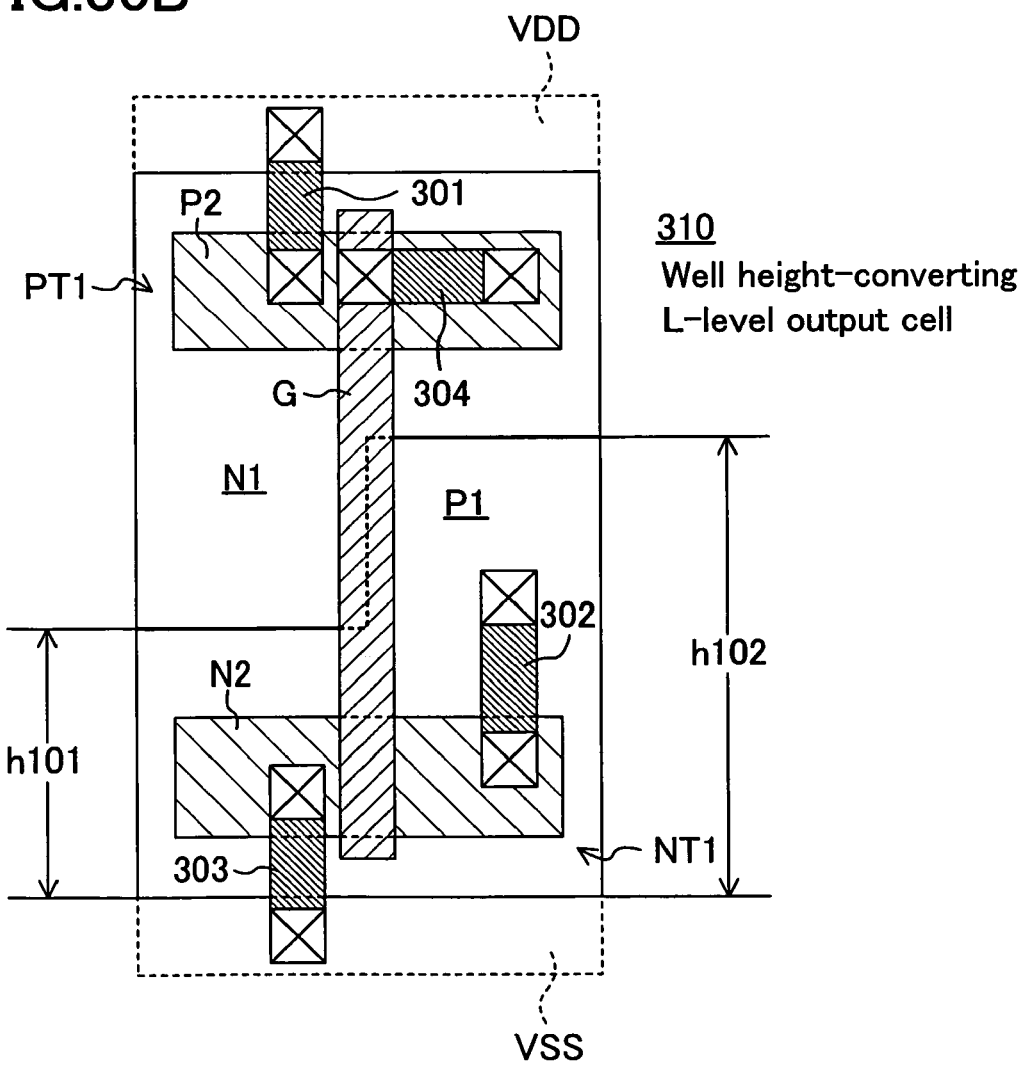
FIG. 30B is a specific layout structure of the well height-converting L-level output cell.
Figure 31:
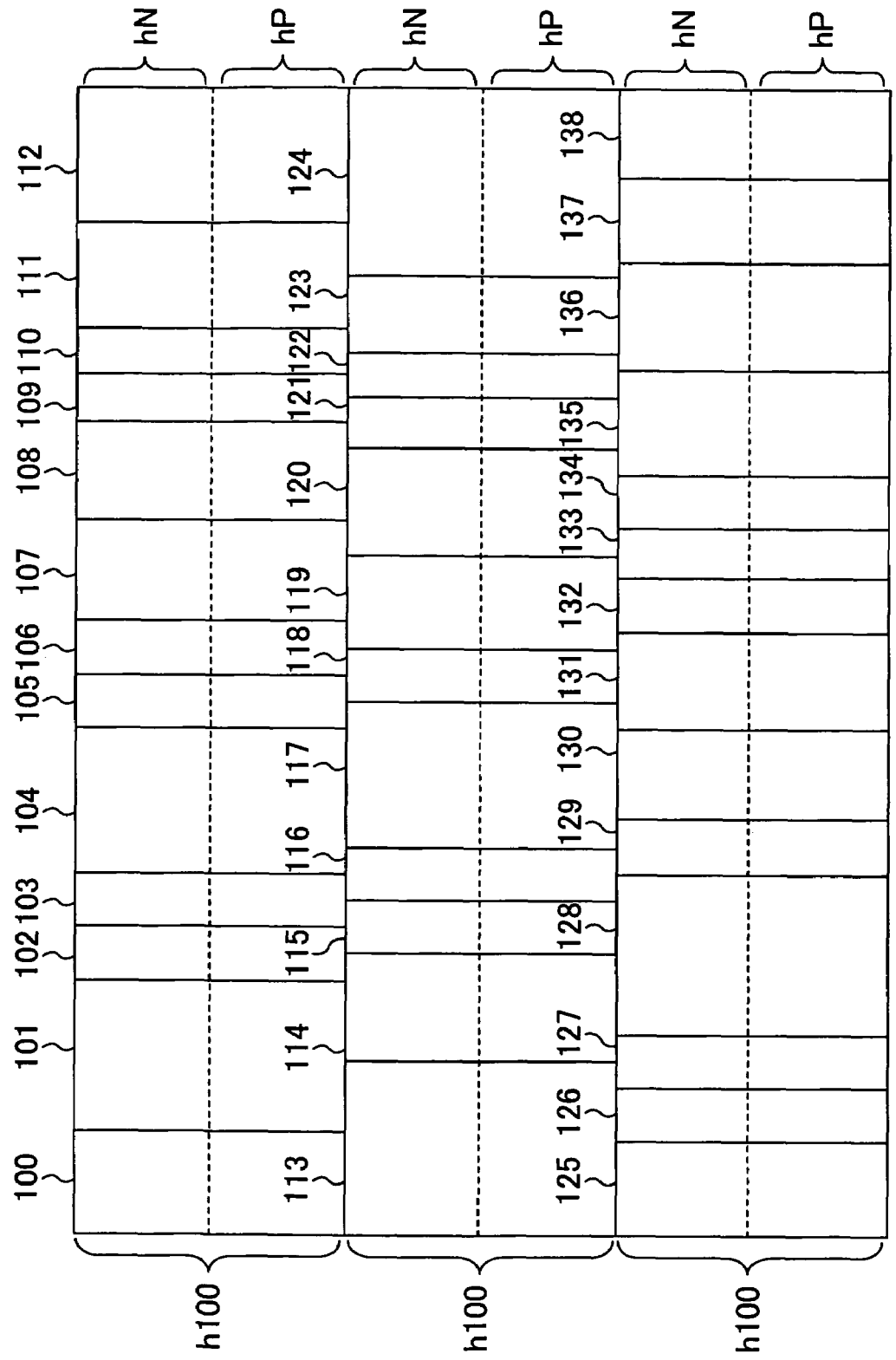
FIG. 31 is a placement diagram illustrating a conventional standard cell semiconductor device.
Figure 32:
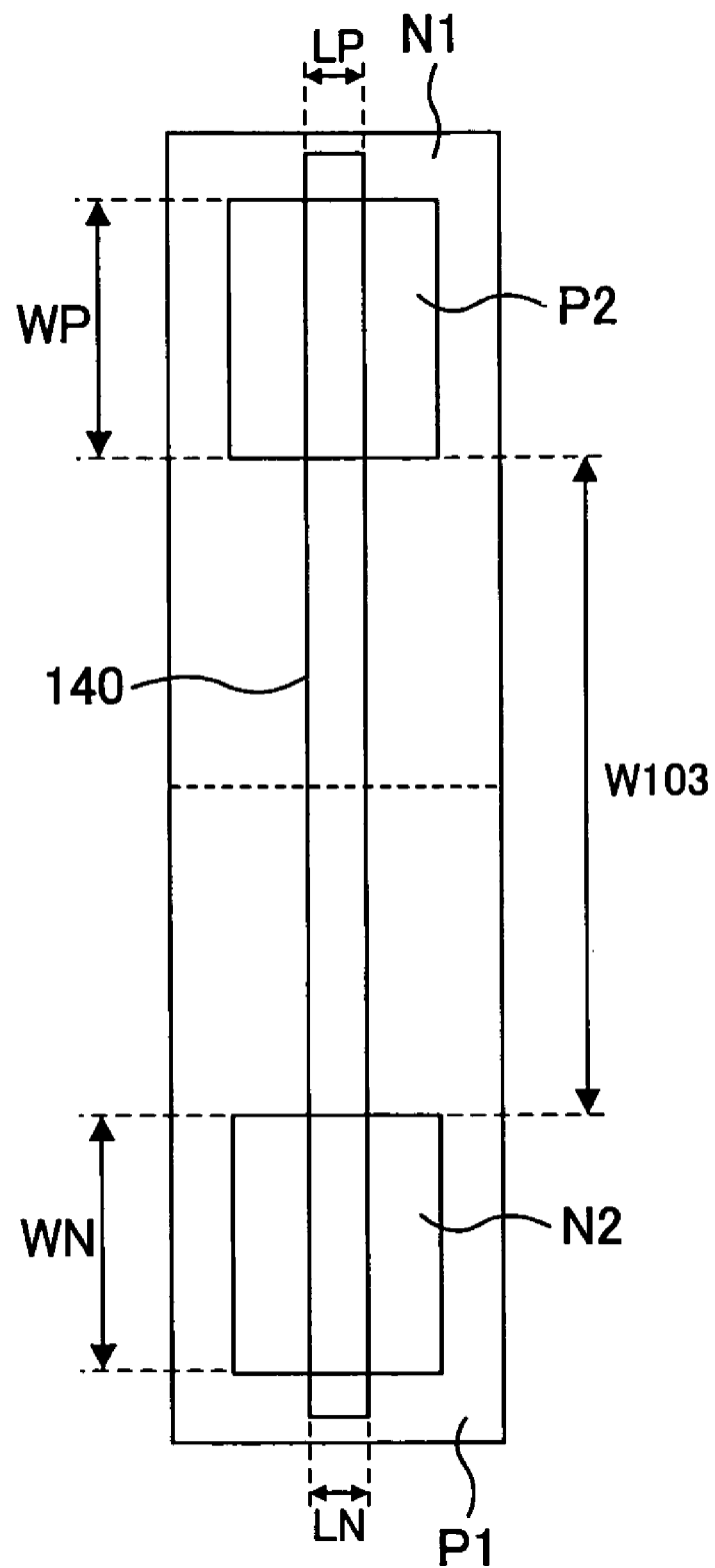
FIG. 32 is a conventional standard cell placement diagram in which small-size transistors are provided.
Figure 33:
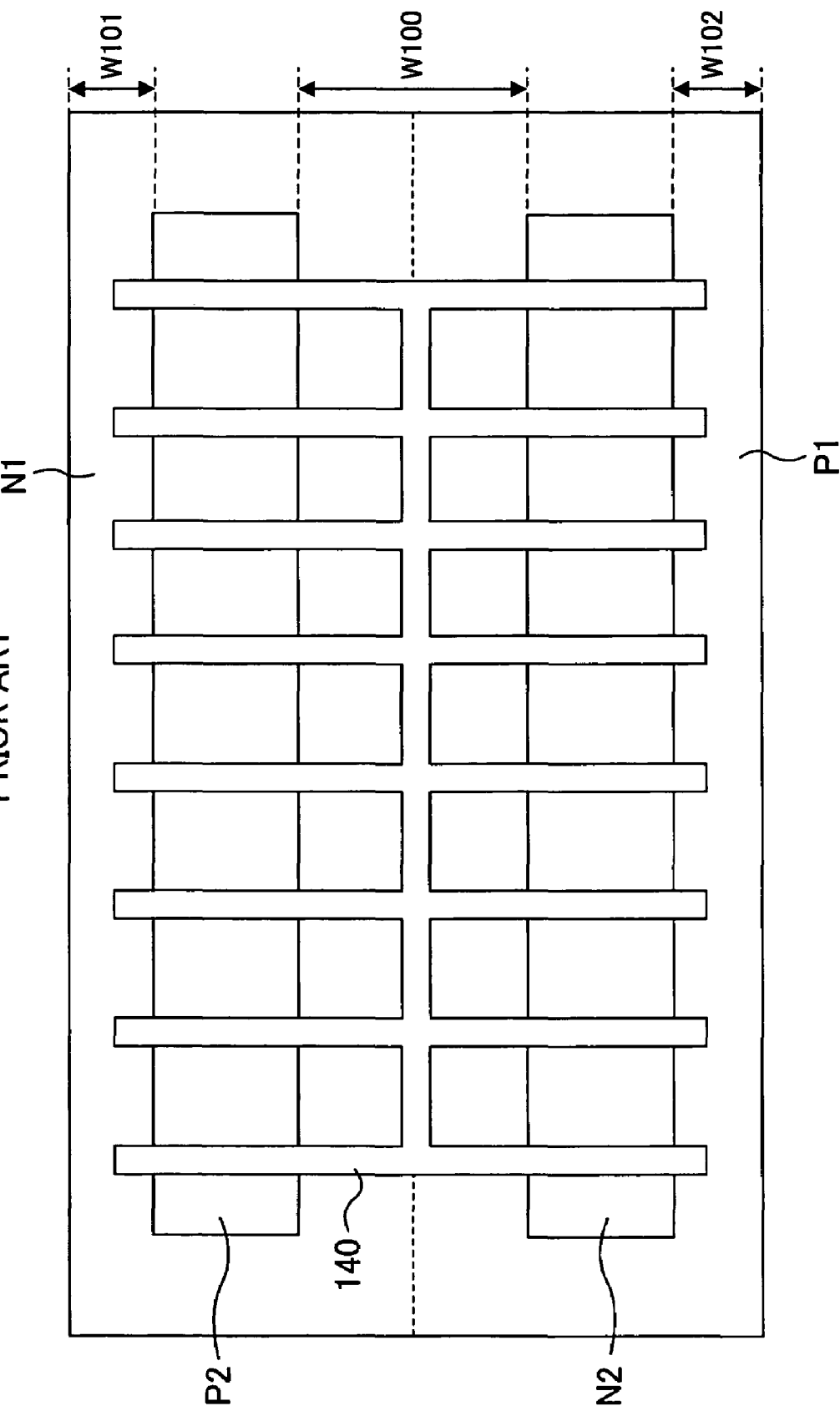
FIG. 33 is a conventional standard cell placement diagram in which large-size transistors are placed in parallel.

FIGS. 30A and 30B illustrate a circuit diagram and a specific layout structure of a well height-converting L-level output cell. The L-level output cell 310 of FIGS. 30A and 30B is a standard cell which has a function of constantly outputting logic "0" (L level). In the L-level output cell 310 of FIG. 30A, a P-type transistor PT1 receives a power source voltage at a source thereof, and is connected via a drain and a gate thereof to a gate of an N-type transistor NT1. The N-type transistor NT1 is connected via a source thereof to the ground, and outputs logic "0" from a drain thereof. The L-level output cell 310 has a specific layout structure as illustrated in FIG. 30B. This layout structure is obtained by mirror-reversing the H-level output cell 300 of FIG. 29B with respect to an imaginary axis extending in the traverse direction, and will not be explained.

Although FIGS. 29A and 29B illustrate the H-level output cell and FIGS. 30A and 30B illustrate the L-level output cell, these cells may be combined and the combined cell may have the layout structure.

According to the standard cell, the standard cell library, the semiconductor device, and the placing method of the present invention, standard cells having various optimal well heights are placed without a design rule error, and further, a substrate contact cell, a power source capacitor cell, an antenna cell, a feed cell, or an H- or L-level output cell is inserted into an appropriate region, whereby the present invention is useful for a semiconductor device having a high level of performance and an excellent level of area efficiency, which is carried in various consumer products.

What is claimed is:

1. A standard cell having an N-well region and a P-well region, wherein a height of the P-well region extending to a border line separating the N-well region and the P-well region is different at one end thereof than at the other end thereof, both the ends contacting other standard cells.

2. The standard cell of claim 1, wherein:
the N-well region has an active region of a P-type transistor;
the P-well region has an active region of an N-type transistor; and
the border line between the N-well region and the P-well region converting the height of the P-well region at one end of the standard cell to be different from the height of the P-well region at the other end of the standard cell and forming the P-well region having the different heights at both the ends, is provided in a region between the active region of the P-type transistor in the N-well region and the active region of the N-type transistor in the P-well region.

3. The standard cell of claim 1, wherein:
the N-well region has a diffusion region for an N-well contact;
the P-well region has a diffusion region for a P-well contact; and
the border line between the N-well region and the P-well region converting the height of the P-well region at one end of the standard cell to be different from the height of the P-well region at the other end of the standard cell and forming the P-well region having the different heights at both the ends, is provided in a region between the diffusion region for an N-well contact in the N-well region and the diffusion region for an N-well contact in the P-well region.

4. The standard cell of claim 1, wherein:
the N-well region has a P-channel power source capacitor transistor;
the P-well region has an N-channel power source capacitor transistor; and
the border line between the N-well region and the P-well region converting the height of the P-well region at one end of the standard cell to be different from the height of the P-well region at the other end of the standard cell and forming the P-well region having the different heights at both the ends, is provided in a region between the P-channel power source capacitor transistor in the N-well region and the N-channel power source capacitor transistor in the P-well region.

5. The standard cell of claim 1, wherein:
any one well region of the N-well region and the P-well region has a diffusion region for forming a diode for suppressing an antenna action; and
the border line between the N-well region and the P-well region converting the height of the P-well region at one end of the standard cell to be different from the height of the P-well region at the other end of the standard cell and forming the P-well region having the different heights at both the ends, is provided in a region other than the diffusion region for forming a diode for suppressing an antenna action.

6. The standard cell of claim 1, wherein:
the N-well region and the P-well region are regions in which a diffusion region is not formed and a wiring line region is provided; and
the border line between the N-well region and the P-well region converting the height of the P-well region at one end of the standard cell to be different from the height of the P-well region at the other end of the standard cell and forming the P-well region having the different heights at both the ends, is provided between the N-well region and the P-well region.

7. The standard cell of claim 1, wherein:
the N-well region has an active region of a P-type transistor of outputting an H level;
the P-well region has an active region of an N-type transistor; and
the border line between the N-well region and the P-well region converting the height of the P-well region at one end of the standard cell to be different from the height of the P-well region at the other end of the standard cell and forming the P-well region having the different heights at both the ends, is provided in a region between the active region of the P-type transistor and the active region of the N-type transistor.

8. The standard cell of claim 1, wherein:
the N-well region has an active region of a P-type transistor;
the P-well region has an active region of an N-type transistor of outputting an L level; and
the border line between the N-well region and the P-well region converting the height of the P-well region at one end of the standard cell to be different from the height of the P-well region at the other end of the standard cell and forming the P-well region having the different heights at both the ends, is provided in a region between the active region of the P-type transistor and the active region of the N-type transistor.

9. A standard cell library comprising the standard cell of claim 1.

10. A standard cell library comprising:
a first standard cell having an N-well region and a P-well region, the P-well region having a first height at both ends thereof;
a second standard cell having an N-well region and a P-well region, the P-well region having a second height at both ends thereof, and the second height being different from the first height; and a third standard cell having an N-well region and a P-well region, the P-well region having the first height at one end thereof and the second height at the other end thereof.

11. The standard cell library of claim 10, further comprising:
    a fourth standard cell having an N-well region and a P-well region, the P-well region having a third height at both ends thereof, and the third height being different from both the first height and the second height; and
    a fifth standard cell having an N-well region and a P-well region, the P-well region having the third height at one end thereof and the first height or the second height at the other end thereof.

12. A semiconductor device designed using the standard cell library of claim 10 comprising the first, second, and third standard cells.

13. The semiconductor device of claim 12, wherein the third standard cell has an active region of a P-type transistor in the N-well region and an active region of an N-type transistor in the P-well region, and the border line between the N-well region and the P-well region converting the height of the P-well region at one end of the standard cell to be different from the height of the P-well region at the other end of the standard cell and forming the P-well region having the different heights at both the ends, is provided in a region between the active region of the P-type transistor in the N-well region and the active region of the N-type transistor in the P-well region.

14. The semiconductor device of claim 12, wherein the third standard cell has a diffusion region for an N-well contact in the N-well region and a diffusion region for a P-well contact in the P-well region, and the border line between the N-well region and the P-well region converting the height of the P-well region at one end of the standard cell to be different from the height of the P-well region at the other end of the standard cell and forming the P-well region having the different heights at both the ends, is provided in a region between the diffusion region for an N-well contact in the N-well region and the diffusion region for an N-well contact in the P-well region.

15. The semiconductor device of claim 12, wherein the third standard cell has a P-channel power source capacitor transistor in the N-well region and an N-channel power source capacitor transistor in the P-well region, and the border line between the N-well region and the P-well region converting the height of the P-well region at one end of the standard cell to be different from the height of the P-well region at the other end of the standard cell and forming the P-well region having the different heights at both the ends, is provided in a region between the P-channel power source capacitor transistor and the N-channel power source capacitor transistor.

16. The semiconductor device of claim 12, wherein the third standard cell has a diffusion region for forming a diode for suppressing an antenna action in any one well region of the N-well region and the P-well region, and the border line between the N-well region and the P-well region converting the height of the P-well region at one end of the standard cell to be different from the height of the P-well region at the other end of the standard cell and forming the P-well region having the different heights at both the ends, is provided in a region other than the diffusion region for forming a diode for suppressing an antenna action.

17. The semiconductor device of claim 12, wherein the N-well region and the P-well region of the third standard cell are regions in which a diffusion region is not formed and a wiring line region is provided, and the border line between the N-well region and the P-well region converting the height of the P-well region at one end of the standard cell to be different from the height of the P-well region at the other end of the standard cell and forming the P-well region having the different heights at both the ends, is provided between the N-well region and the P-well region.

18. The semiconductor device of claim 12, wherein the third standard cell has a an active region of a P-type transistor of outputting an H level in the N-well region and an active region of an N-type transistor in the P-well region, and the border line between the N-well region and the P-well region converting the height of the P-well region at one end of the standard cell to be different from the height of the P-well region at the other end of the standard cell and forming the P-well region having the different heights at both the ends, is provided in a region between the active region of the P-type transistor and the active region of the N-type transistor.

19. The semiconductor device of claim 12, wherein the third standard cell has an active region of a P-type transistor in the N-well region and an active region of an N-type transistor of outputting an L level in the P-well region, and the border line between the N-well region and the P-well region converting the height of the P-well region at one end of the standard cell to be different from the height of the P-well region at the other end of the standard cell and forming the P-well region having the different heights at both the ends, is provided in a region between the active region of the P-type transistor and the active region of the N-type transistor.

20. A placing method for the semiconductor device of claim 12, comprising:
    a placement step of placing a plurality of the first standard cells and a plurality of the second standard cells;
    a replacement step of replacing any one of predetermined first and second standard cells adjacent to each other of the plurality of first standard cells and the plurality of second standard cells, with the third standard cell; and
    a third standard cell inserting step of inserting the third standard cell between another first standard cell and another second standard cell adjacent to each other of the plurality of first standard cell and the plurality of second standard cells.

21. The placing method of claim 20, further comprising:
    a placement changing step of determining whether or not the number of portions at which the first standard cell and the second standard cell are adjacent to each other in the semiconductor device is reduced by exchanging placement positions of a predetermined one of the first or second standard cells and another one of the first or second standard cells located within a predetermined region from the predetermined first or second standard cell, and when it is determined that the number of portions is reduced, changing the placement positions.

22. A placing method for the semiconductor device of claim 14, wherein the semiconductor device further comprises a sixth standard cell having a diffusion region for an N-well contact in the N-well region and a diffusion region for a P-well contact in the P-well region, and having the first height at both ends of the P-well region, and a seventh standard cell having a diffusion region for an N-well contact in the N-well region and a diffusion region for a P-well contact in the P-well region, and having the second height at both ends of the P-well region, the method comprising:
    a placement step of placing the first standard cell and the second standard cell;

a third standard cell inserting step of inserting the third standard cell between the first and second standard cells adjacent to each other;

a sixth standard cell insertion step of inserting the sixth standard cell between two of the first standard cells in the predetermined region when the third standard cell is not present in the predetermined region; and a seventh standard cell insertion step of inserting the seventh standard cell between two of the second standard cells in the predetermined region when the third standard cell is not present in the predetermined region.

23. A placing method for the semiconductor device of claim 15, wherein the semiconductor device further comprises an eighth standard cell having a P-channel power source capacitor transistor in the N-well region and an N-channel power source capacitor transistor in the P-well region, and having the first height at both ends of the P-well region, and a ninth standard cell having a P-channel power source capacitor transistor in the N-well region and an N-channel power source capacitor transistor in the P-well region, and having the second height at both ends of the P-well region, the method comprising:

a placement step of placing the first standard cell and the second standard cell;

a third standard cell inserting step of inserting the third standard cell between the first and second standard cells adjacent to each other;

an eighth standard cell insertion step of inserting the eighth standard cell between two of the first standard cells in the predetermined region when the third standard cell is not present in the predetermined region; and a ninth standard cell insertion step of inserting the ninth standard cell between two of the second standard cells in the predetermined region when the third standard cell is not present in the predetermined region.

24. The placing method of claim 23, further comprising:

a consumed current analyzing step of analyzing a consumed current amount of the standard cell after placement, wherein the eighth standard cell insertion step inserts the eighth standard cell into two of the first standard cells in a region in which the consumed current amount analyzed by the consumed current analyzing step exceeds a predetermined reference, and the ninth standard cell insertion step inserts the ninth standard cell into two of the second standard cells in a region in which the consumed current amount analyzed by the consumed current analyzing step exceeds the predetermined reference.

* * * * *